United States Patent
Lin et al.

(10) Patent No.: US 12,520,577 B2
(45) Date of Patent: Jan. 6, 2026

(54) COMPLEMENTARY FIELD EFFECT TRANSISTOR WITH HYBRID NANOSTRUCTURE

(71) Applicant: Taiwan Semiconductor Manufacturing Co., Ltd., Hsinchu (TW)

(72) Inventors: Meng-Yu Lin, Hsinchu (TW); Yi-Han Wang, Hsinchu (TW); Chun-Fu Cheng, Hsinchu (TW); Cheng-Yin Wang, Hsinchu (TW); Yi-Bo Liao, Hsinchu (TW); Szuya Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 636 days.

(21) Appl. No.: 17/888,261

(22) Filed: Aug. 15, 2022

(65) Prior Publication Data

US 2023/0307456 A1    Sep. 28, 2023

Related U.S. Application Data

(60) Provisional application No. 63/322,488, filed on Mar. 22, 2022.

(51) Int. Cl.
| | | |
|---|---|---|
| *H10D 84/85* | (2025.01) | |
| *H10D 30/01* | (2025.01) | |
| *H10D 30/43* | (2025.01) | |
| *H10D 30/67* | (2025.01) | |
| *H10D 62/10* | (2025.01) | |

(Continued)

(52) U.S. Cl.
CPC ........ *H10D 84/853* (2025.01); *H10D 30/014* (2025.01); *H10D 30/43* (2025.01); *H10D 30/6735* (2025.01); *H10D 30/6757* (2025.01); *H10D 62/121* (2025.01);

(Continued)

(58) Field of Classification Search
CPC .... H10D 84/853; H10D 30/014; H10D 30/43; H10D 30/6735
See application file for complete search history.

(56) References Cited

U.S. PATENT DOCUMENTS

| | | | | |
|---|---|---|---|---|
| 11,201,153 B2 * | 12/2021 | Xie | ................... | H10D 30/6735 |
| 11,798,851 B2 * | 10/2023 | Xie | ................... | H10D 84/0193 |

(Continued)

FOREIGN PATENT DOCUMENTS

| | | | | | |
|---|---|---|---|---|---|
| CN | 115911010 A | * | 4/2023 | ....... | H01L 21/02603 |
| CN | 116435305 A | * | 7/2023 | ......... | H10D 84/0167 |

(Continued)

*Primary Examiner* — Laura M Menz
(74) *Attorney, Agent, or Firm* — Seed IP Law Group

(57) ABSTRACT

An integrated circuit includes a complementary field effect transistor (CFET). The CFET includes a first transistor having a first semiconductor nanostructure corresponding to a channel region of the first semiconductor nanostructure and a first gate metal surrounding the second semiconductor nanostructure. The CFET includes a transistor including a second semiconductor nanostructure above the first semiconductor nanostructure and a second gate metal surrounding the second semiconductor nanostructure. The CFET includes an isolation structure between the first and second semiconductor nanostructures.

11 Claims, 15 Drawing Sheets

(51) Int. Cl.
*H10D 62/13* (2025.01)
*H10D 84/01* (2025.01)
*H10D 84/03* (2025.01)

(52) U.S. Cl.
CPC ....... *H10D 62/151* (2025.01); *H10D 84/0167* (2025.01); *H10D 84/017* (2025.01); *H10D 84/038* (2025.01)

(56) References Cited

U.S. PATENT DOCUMENTS

| | | | |
|---|---|---|---|
| 11,869,893 B2* | 1/2024 | Xie | H10D 62/822 |
| 12,040,365 B1* | 7/2024 | Lai | H01L 21/324 |
| 12,062,693 B2* | 8/2024 | Yu | H10D 30/6735 |
| 12,237,333 B2* | 2/2025 | Chanemougame | H01L 21/28123 |
| 2021/0184000 A1 | 6/2021 | Ramaswamy et al. | |
| 2021/0265348 A1* | 8/2021 | Xie | H10D 88/01 |
| 2021/0320035 A1* | 10/2021 | Xie | H10D 84/85 |
| 2021/0408257 A1 | 12/2021 | Thomas et al. | |
| 2022/0052047 A1* | 2/2022 | Xie | H10D 84/0167 |
| 2022/0068921 A1* | 3/2022 | Chanemougame | H10D 30/6735 |
| 2022/0085012 A1* | 3/2022 | Liebmann | H01L 21/76895 |
| 2022/0199799 A1* | 6/2022 | O'Brien | H10D 99/00 |
| 2023/0062026 A1* | 3/2023 | Yu | H10D 64/017 |
| 2023/0154996 A1* | 5/2023 | Bao | H10D 30/6757 257/288 |
| 2023/0197814 A1* | 6/2023 | Xie | H10D 88/01 257/401 |
| 2023/0307456 A1* | 9/2023 | Lin | H10D 88/00 |
| 2024/0006245 A1* | 1/2024 | Xie | H10D 84/0167 |
| 2024/0072115 A1* | 2/2024 | You | H10D 84/0186 |
| 2024/0072136 A1* | 2/2024 | Lin | H10D 30/6729 |
| 2024/0204109 A1* | 6/2024 | Li | H10D 30/6757 |
| 2024/0222429 A1* | 7/2024 | Van Dal | H10D 84/038 |
| 2024/0290630 A1* | 8/2024 | Lai | H10D 30/43 |
| 2024/0290662 A1* | 8/2024 | Chuang | H01L 21/3115 |
| 2024/0304685 A1* | 9/2024 | Hou | H10D 84/853 |
| 2024/0314998 A1* | 9/2024 | Wang | H10B 10/125 |
| 2024/0321640 A1* | 9/2024 | Chen | H10D 84/856 |
| 2024/0321646 A1* | 9/2024 | Lin | H10D 84/0167 |
| 2024/0347606 A1* | 10/2024 | Lai | H10D 64/01 |
| 2024/0363687 A1* | 10/2024 | Yu | H10D 30/43 |
| 2024/0387651 A1* | 11/2024 | Wang | H10D 30/014 |
| 2025/0006812 A1* | 1/2025 | Naskar | H10D 84/038 |
| 2025/0006816 A1* | 1/2025 | Lin | H10D 84/017 |
| 2025/0151358 A1* | 5/2025 | Lim | H10D 62/121 |
| 2025/0159968 A1* | 5/2025 | Lin | H10D 84/0177 |
| 2025/0159981 A1* | 5/2025 | Chanemougame | H10D 30/6713 |

FOREIGN PATENT DOCUMENTS

| | | | | |
|---|---|---|---|---|
| CN | 118213327 A | * | 6/2024 | ........ H10D 84/0135 |
| CN | 118712135 A | * | 9/2024 | ............ H10D 88/01 |
| CN | 119673861 A | * | 3/2025 | ........ H10D 30/6735 |
| CN | 222564256 U | * | 3/2025 | ........ H10D 84/0186 |
| CN | 119815854 A | * | 4/2025 | ........ H10D 30/6735 |
| DE | 102024100409 A1 | * | 9/2024 | ........... H10D 30/024 |
| DE | 102024100689 A1 | * | 9/2024 | ........ H10D 84/0188 |
| DE | 102024101841 A1 | * | 9/2024 | ............. H10D 30/62 |
| KR | 20240137481 A | * | 9/2024 | ............ H10D 30/62 |
| KR | 20240143905 A | * | 10/2024 | ........... H10D 30/024 |
| KR | 20240143973 A | * | 10/2024 | ........ H10D 84/0188 |
| TW | 202127670 A | | 7/2021 | |
| TW | 202135242 A | | 9/2021 | |
| TW | 202209449 A | | 3/2022 | |
| WO | WO-2024137197 A1 | * | 6/2024 | ........ H10D 84/8311 |
| WO | WO-2025005950 A1 | * | 1/2025 | ........ H10D 30/6757 |

* cited by examiner

COMPLEMENTARY FIELD EFFECT TRANSISTOR WITH HYBRID NANOSTRUCTURE

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Complementary field effect transistors (CFETs) may be utilized to increase the density of transistors in an integrated circuit. A CFET may include an N-type transistor and a P-type transistor stacked vertically. The gate electrodes of the N-type and P-type transistors may be electrically shorted together.

However, there are various difficulties associated with formation of CFETs. For example, it can be difficult to form gate electrodes having desired characteristics in stacked transistors. The result is that one or both of the stacked transistors of the CFET may not function properly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
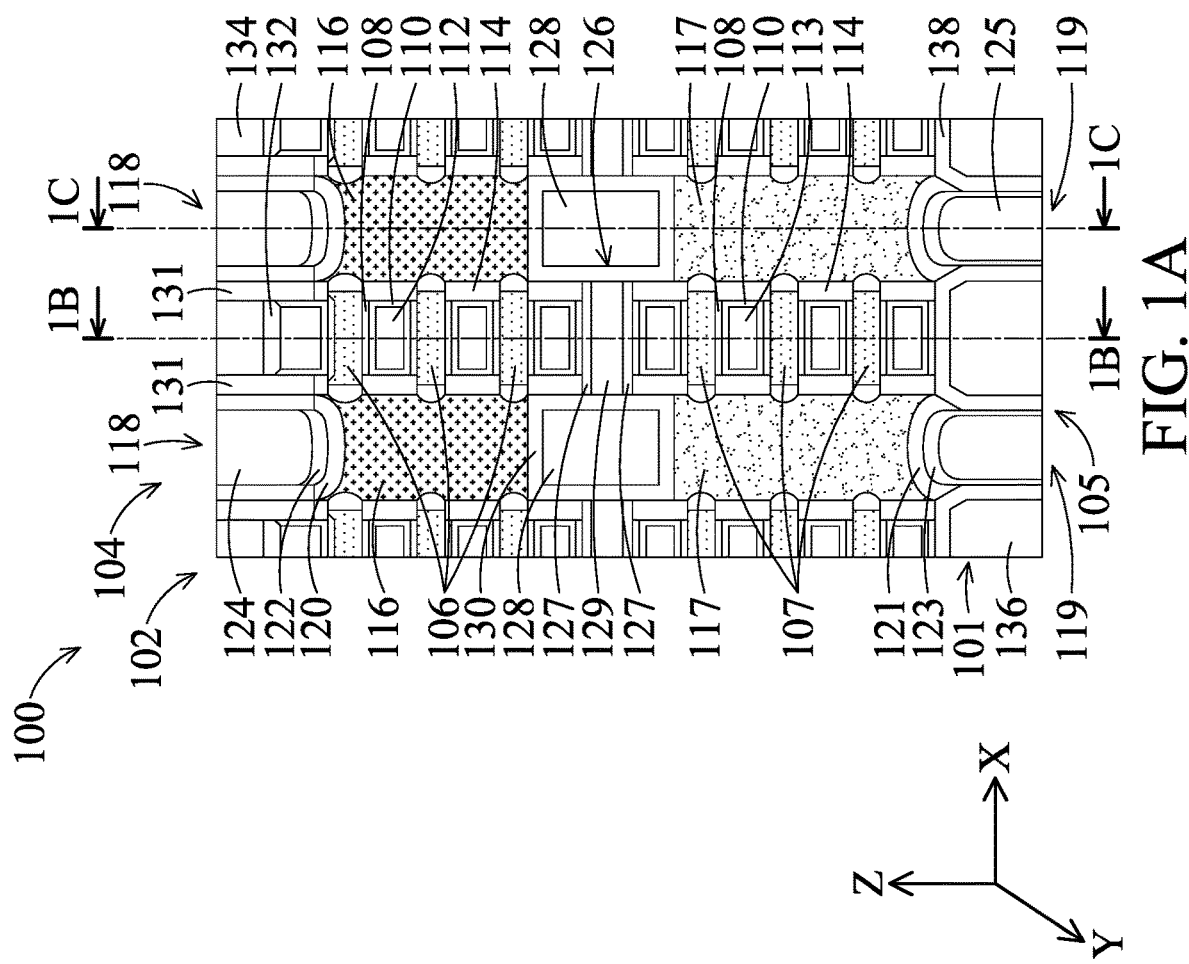
FIGS. 1A-1D are views of an integrated circuit including a CFET, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with a CFET having improved electrical characteristics. The CFET includes a first transistor stacked vertically on a second transistor. The first and second transistors each have a plurality of semiconductor nanostructures that act as the channel regions for the first and second transistors. A first gate metal surrounds the semiconductor nanostructures of the first transistor. A second gate metal surrounds the semiconductor nanostructures of the second transistor. The CFET includes an isolation structure positioned between the lowest semiconductor nanostructure of the first transistor and the highest semiconductor nanostructure of the second transistor. The presence of the isolation structure helps ensure that there will not be any undesired remnants of the gate metal of the second transistor around the lowest semiconductor nanostructure of the first transistor.

This helps ensure that the gate metal of the second transistor will not interfere with the work function of the first transistor. The result is that the threshold voltage of the first transistor will not be undesirably affected by the gate metal of the second transistor. Furthermore, the presence of the isolation structure can reduce the gate to drain capacitance of the first and second transistors. This results in better functioning CFETs, better functioning integrated circuits, and increased wafer yields.

FIG. 1A is a cross-sectional view of an integrated circuit 100, in accordance with some embodiments. The integrated circuit 100 includes a complimentary field effect transistor (CFET) 102. The CFET 102 includes a first transistor 104 of a first conductivity type and a second transistor 105 of a second conductivity type. The first transistor 104 is vertically stacked on the second transistor 105. As will be set forth in more detail below, the CFET 102 utilizes an isolation structure 126 to separate the stacked channel regions of the first transistor 104 from the stacked channel regions of the second transistor 105 in order to improve electrical characteristics of the CFET 102. In other words, a hybrid nanostructure (e.g. hybrid sheet) including the stacked channel region of first transistor 104, isolation structure 126, and the stacked channel region of second transistor 105 is formed.

The CFET transistor 102 may correspond to a gate all around transistor. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around CFET 102 may include a plurality of semiconductor nanostructures corresponding to channel regions of the CFET 102. The semiconductor nanostructures may include nanosheets, nanowires, or other types of nanostructures. The gate all around transistors may also be termed nanostructure transistors.

The view of FIG. 1A is an X-view of the integrated circuit 100 in which the X-axis is the horizontal axis, the Z-axis is the vertical axis, and the Y-axis extends into and out of the drawing sheet. As used herein, the term "X-view" corresponds to a cross-sectional view in which the X-axis is the horizontal dimension and the Z-axis is the vertical dimension. As used herein, the term "Y-view" corresponds to a cross-sectional view in which the Y-axis is the horizontal dimension and the Z-axis is the vertical dimension.

The integrated circuit 100 includes a substrate 101. The substrate 101 can include a semiconductor layer, a dielectric layer, or combinations of semiconductor layers and dielectric layers. Furthermore, conductive structures may be formed within the substrate 101 as backside conductive vias and interconnections, as will be described in more detail below. In some embodiments, the substrate 101 includes a single crystalline semiconductor layer on at least a surface portion. The substrate 101 may include a single crystalline semiconductor material such as, but not limited to Si, Ge, SiGe, GaAs, InSb, GaP, GaSb, InAlAs, InGaAs, GaSbP, GaAsSb and InP.

In some embodiments, the substrate 101 may include dielectric layers including one or more of can include silicon oxide, silicon nitride, silicon oxynitride, silicon carbonitride, silicon oxycarbonitride, fluorine-doped silicate glass (FSG), a low-K dielectric material or other dielectric materials. In some embodiments, the substrate 101 may include shallow trench isolation regions formed in a semiconductor layer. Various configurations of a substrate 101 can be utilized without departing from the scope of the present disclosure.

The transistor 105 is formed above the substrate 101. The transistor 104 is formed above the transistor 105. In some embodiments, the transistor 104 is an N-type transistor and the transistor 105 is a P-type transistor. However, in some embodiments, the transistor 104 may be a P-type transistor and the transistor 105 may be an N-type transistor.

The transistor 104 includes a plurality of semiconductor nanostructures 106. The semiconductor nanostructures 106 are stacked in the vertical direction or Z-direction. In the example of FIG. 1A, there are three stacked semiconductor nanostructures 106. However, in practice, there may be only two stacked nanostructures 106 or there may be more than three stacked semiconductor nanostructures 106 without departing from the scope of the present disclosure. Furthermore, in some embodiments there may be only a single semiconductor nanostructure 106 and a single semiconductor nanostructure 107. The semiconductor nanostructures 106 correspond to channel regions of the transistor 102. The semiconductor nanostructures 106 may be nanosheets, nanowires, or other types of nanostructures.

The transistor 105 includes a plurality of semiconductor nanostructures 107. The semiconductor nanostructures 107 are stacked in the vertical direction or Z-direction. In the example of FIG. 1A, there are three stacked semiconductor nanostructures 107. However, in practice, there may be only two stacked nanostructures 107 or there may be more than three stacked semiconductor nanostructures 107 without departing from the scope of the present disclosure. The semiconductor nanostructures 107 correspond to channel regions of the transistor 102. The semiconductor nanostructures 107 may be nanosheets, nanowires, or other types of nanostructures. The number of semiconductor nanostructures 107 may be the same as the number of semiconductor nanostructures 106 or may be different than the number of semiconductor nanostructures 106.

The semiconductor nanostructures 106 and 107 may include Si, SiGe, or other semiconductor materials. In a non-limiting example described herein, the semiconductor nanostructures 106 are silicon. The vertical thickness of the semiconductor nanostructures 106 can be between 2 nm and 5 nm. The semiconductor nanostructures 106 may be separated from each other in the vertical direction by 4 nm to 10 nm. Other thicknesses and materials can be utilized for the semiconductor nanostructures 106 without departing from the scope of the present disclosure. The semiconductor nanostructures 107 may have a same material and dimensions as the semiconductor nanostructures 106 or a different semiconductor material from the semiconductor nanostructures 106.

The transistors 104 and 105 include a gate dielectric. The gate dielectric includes an interfacial gate dielectric layer 108 and a high-K gate dielectric layer 110. The interfacial gate dielectric layer 108 is a low-K gate dielectric layer. The interfacial gate dielectric layer is in contact with the semiconductor nanostructures 106 and 107. The high-K gate dielectric layer 110 is in contact with the low-K gate dielectric layer. The interfacial gate dielectric layer 108 is positioned between the semiconductor nanostructures 106 and the high-K gate dielectric layer 110 and between the semiconductor nanostructures 107 and the high-K gate dielectric layer 110.

The interfacial gate dielectric layer 108 can include a dielectric material such as silicon oxide, silicon nitride, or other suitable dielectric materials. The interfacial gate dielectric layer 108 can include a comparatively low-K dielectric with respect to high-K dielectric such as hafnium oxide or other high-K dielectric materials that may be used in gate dielectrics of transistors. The interfacial gate dielectric layer 108 can include a native oxide layer that grows on surfaces of the semiconductor nanostructures 106 and 107. The interfacial gate dielectric layer 108 have a thickness between 0.4 nm and 2 nm. Other materials, configurations, and thicknesses can be utilized for the interfacial gate dielectric layer 108 without departing from the scope of the present disclosure The high-K gate dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes $HfO_2$ with dipole doping including La and Mg, and a second layer including a higher-K ZrO layer with crystallization.

The transistor 104 includes a gate metal 112. The gate metal 112 surrounds the semiconductor nanostructures 106. The gate metal 112 is in contact with the high-K gate dielectric layer 110. The gate metal 112 corresponds to a gate electrode of the transistor 104. In an example in which the transistor 104 is an N-type transistor, the gate metal 112 can include a material that results in a desired work function with the semiconductor nanostructures 106. In one example, the gate metal 112 includes titanium aluminum, titanium, aluminum, tungsten, copper, gold, or other conductive materials.

FIG. 1A illustrates a single gate metal 112. However, in practice, the gate electrode from the transistor 104 can include multiple metal layers. For example, the gate metal 112 can include one or more liner layers or adhesive layers such as tantalum, tantalum nitride, titanium nitride, or other materials. The gate metal 112 can include a gate fill material that fills the remaining volume between the semiconductor nanostructures 106 after the one or more liner layers have been deposited. Various materials, combinations of materials, and configurations may be utilized for the gate metal 112 without departing from the scope of the present disclosure.

The transistor 105 includes a gate metal 113. The gate metal 113 surrounds the semiconductor nanostructures 107. The gate metal 113 is in contact with the high-K gate dielectric layer 110. The gate metal 113 corresponds to a gate electrode of the transistor 105. In an example in which the transistor 105 is a P-type transistor, the gate metal 113 can include a material that results in a desired work function with the semiconductor nanostructures 107. In one example, the gate metal 113 includes titanium nitride, titanium, aluminum, tungsten, copper, gold, or other conductive materials.

FIG. 1A illustrates a single gate metal 113. However, in practice, the gate electrode from the transistor 105 can include multiple metal layers that wrap around the semiconductor nanostructures 107. For example, the gate metal 113 can include one or more liner layers or adhesive layers such as tantalum, tantalum nitride, titanium nitride, or other materials. The gate metal 113 can include a gate fill material that fills the remaining volume between the semiconductor nanostructures 107 after the one or more liner layers have been deposited. Various materials, combinations of materials, and configurations may be utilized for the gate metal 113 without departing from the scope of the present disclosure.

The transistor 104 includes source/drain regions 116. The source/drain regions 116 are in contact with each of the semiconductor nanostructures 106. Each semiconductor nanostructure 106 extends in the X-direction between the source/drain regions 116. The source/drain regions 116 include a semiconductor material. The transistor 105 includes source/drain regions 117. The source/drain regions 117 are in contact with each of the semiconductor nanostructures 107. Each semiconductor nanostructure 107 extends in the X-direction between the source/drain regions 117. The source/drain regions 117 include a semiconductor material.

In an example in which the transistor 104 is an N-type transistor and the transistor 105 is a P-type transistor, the source/drain regions 116 can be doped with N-type dopants species. The N-type dopant species can include P, As, or other N-type dopant species. The source/drain regions 117 can be doped with P-type dopant species in the case of a P-type transistor. The P-type dopant species can include B or other P-type dopant species. The doping can be performed in-situ during an epitaxial growth process of the source/drain regions 117. The source/drain regions 116 and 117 can include other materials and structures without departing from the scope of the present disclosure.

As used herein, the term "source/drain region" may refer to a source region or a drain region individually or collectively dependent upon the context. Accordingly, one of the source/drain regions 116 may be a source region while the other source/drain region 116 is a drain region, or vice versa. Furthermore, in some cases, one or both of the source/drain regions 116 may be shared with a laterally adjacent transistor.

The transistors 104 and 105 each include inner spacers 114. The inner spacers 114 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. In one example, the inner spacers 114 include silicon oxycarbonitride.

The inner spacers 114 of the transistor 104 physically separate the gate metal 112 from the source/drain regions 116. This prevents short circuits between the gate metal 112 and the source/drain regions 116. The inner spacers 114 of the transistor 105 physically separate the gate metal 113 from the source/drain regions 117. This prevents short circuits between the gate metal 113 and the source/drain regions 117.

The transistor 104 may include source/drain contacts 118. Each source/drain contact 118 is positioned over and is electrically connected to a respective source/drain region 116. Electrical signals may be applied to the source/drain regions 116 via the source/drain contacts. The source/drain contacts 118 may include silicide 120. The silicide 120 is formed at the top of the source/drain regions 116. The silicide 120 can include titanium silicide, aluminum silicide, nickel silicide, tungsten silicide, or other suitable silicides.

The source/drain contacts 118 may also include a conductive layer 122 positioned on the silicide 120. The conductive layer can include titanium nitride, tantalum nitride, titanium, tantalum, or other suitable conductive materials. The source/drain contacts 118 may also include a conductive layer 124 on the conductive layer 122. The conductive layer 124 can include a conductive material such as tungsten, cobalt, ruthenium, titanium, aluminum, tantalum, or other suitable conductive materials. Other materials and configurations can be utilized for the source/drain contacts 118 without departing from the scope of the present disclosure.

The transistor 105 may include source/drain contacts 119. Each source/drain contact 119 is positioned below and is electrically connected to a respective source/drain region 117. Electrical signals may be applied to the source/drain regions 117 via the source/drain contacts. The source/drain contacts 119 may include silicide 121. The silicide 121 is formed at the bottom of the source/drain regions 117. The silicide 121 can include titanium silicide, aluminum silicide, nickel silicide, tungsten silicide, or other suitable silicides.

The source/drain contacts 119 may also include a conductive layer 123 positioned on the silicide 121. The conductive layer can include titanium nitride, tantalum nitride, titanium, tantalum, or other suitable conductive materials. The source/drain contacts 119 may also include a conductive layer 125 on the conductive layer 123. The conductive layer 125 can include a conductive material such as tungsten, cobalt, ruthenium, titanium, aluminum, tantalum, or other suitable conductive materials. Other materials and configurations can be utilized for the source/drain contacts 119 without departing from the scope of the present disclosure.

The transistor 102 includes sidewall spacers 131. The sidewall spacers 131 are positioned adjacent to the uppermost portion of the gate metal 112 and electrically isolate the gate metal 112 from the source/drain contacts 118. The sidewall spacers 131 may include one or more of silicon oxide, silicon nitride, silicon oxynitride, silicon carbonitride, silicon oxycarbonitride, fluorine-doped silicate glass (FSG), a low-K dielectric material or other dielectric materials. Other thicknesses and materials can be utilized for the sidewall spacers 131 without departing from the scope of the present disclosure.

The transistor 102 may include a gate cap metal 132 positioned on an uppermost portion of the gate metal 112. In some embodiments, the gate cap metal 132 includes tungsten, fluorine free tungsten, or other suitable conductive materials. The gate cap metal 132 may have a height between 1 nm and 10 nm. Other configurations, materials, and thicknesses can be utilized for the gate cap metal 132 without departing from the scope of the present disclosure.

The substrate 101 may include a dielectric layer 136 and a dielectric layer 138. The dielectric layer 138 may be positioned in contact with sidewalls of the source/drain contacts 119 and a lowermost portion interfacial gate dielectric layer 108 of the transistor 105. The dielectric layer 138 may include silicon oxide, silicon nitride, silicon oxynitride, silicon carbonitride, silicon oxycarbonitride, fluorine-doped silicate glass (FSG), a low-K dielectric material or other dielectric materials. The dielectric layer 136 is positioned in contact with the dielectric layer 138. The dielectric layer 136 may include silicon oxide, silicon nitride, silicon oxynitride, silicon carbonitride, silicon oxycarbonitride, fluorine-doped silicate glass (FSG), a low-K dielectric material or other dielectric materials.

The transistor 102 can be operated by applying voltages to the source/drain regions 116/117 and the gate metals 112/113. The voltages can be applied to the source/drain regions 116/117 via the source/drain contacts 118/119. The voltages can be applied to the gate metals 112/113 via a gate contact not shown in FIG. 1A. Though not apparent in the view of FIG. 1A, the gate metal 112 and the gate metal 113 are shorted together. Accordingly, the gate metal 112 and the gate metal 113 jointly correspond to the gate electrode of the CFET 102. The voltage applied to the gate metals 112/113 may turn on the transistor 104 and turn off the transistor 105 or may turn on the transistor 105 and turn off the transistor 104. While the gate metals 112/113 are shorted together, the source/drain regions 116 are not shorted together with the source/drain regions 117. Depending on a particular electrical circuit configuration, the flow of current can be selectively enabled or prohibited through the source/drain regions 116 and 117 individually.

As described previously, it may be beneficial to obtain desired work functions for the transistors 104 and 105 by utilizing different materials for the gate metals 112 and 113. One possible way of forming the gate metals 112/113 is to first deposit the gate metal 113 around all of the semiconductor nanostructures 106 and 107 and then to perform a timed etch to remove the gate metal 113 from around the semiconductor nanostructures 106. This is followed by depositing the gate metal 112 around the semiconductor nanostructures 106 after the timed etch of the gate metal 113. However, one drawback of this process is that in some cases the gate metal 113 may not be entirely removed directly below the lowest semiconductor nanostructure 106. This can interfere with the work function of the transistor 104, thereby affecting the threshold voltage of the transistor 104 in an undesired manner.

The CFET 102 avoids the possibility of work function interference by utilizing an isolation structure 126 between the semiconductor nanostructures 106 and the semiconductor nanostructures 107. More particularly, the isolation structure 126 is positioned directly between the lowest semiconductor nanostructure 106 and the highest semiconductor nanostructure 107. The isolation structure 126 may include upper and lower semiconductor layers 127 and a dielectric layer 129 between the upper and lower semiconductor layers 127. Various structures and compositions can be utilized for the isolation structure 126 without departing from the scope of the present disclosure.

The dielectric layer 129 may include silicon oxide, silicon nitride, silicon oxynitride, silicon carbonitride, silicon oxycarbonitride, fluorine-doped silicate glass (FSG), a low-K dielectric material or other dielectric materials. The dielectric layer 129 may have a length in the X direction between 15 nm and 30 nm. A length in this range may be sufficient to match or exceed the length of the semiconductor nanostructures 106 and 107 in the X direction. However, depending on the length of the semiconductor nanostructures 106 and 107, a greater or lower length of the dielectric layer 129 may be selected. The dielectric layer 129 may have a height in the Z direction between 5 nm and 25 nm. These dimensions may be sufficient to ensure that there is no possibility of work function interference from the gate metal 113 with the semiconductor nanostructures 106. Furthermore, these dimensions may provide reduced gate to drain capacitance. Other materials, dimensions, and configurations can be utilized for the dielectric layer 129 without departing from the scope of the present disclosure. The dielectric layer 129 may be termed a dielectric nanostructure. The dielectric nanostructure can include a dielectric nanosheet, the dielectric nanowires, or another type of dielectric nanostructure.

The dielectric layer 129 has a top surface 135 and a bottom surface 137. The gate metals 112 and 113 meet at an interface 139. In some embodiments, the interface 139 between the gate metals 112 and 113 is lower than a top surface 135 of the dielectric layer 129. In some embodiments, the interface 139 is lower than a top surface 135 and higher than a bottom surface 137 of the dielectric layer 139. This can help to ensure that there is not work function interference of the transistor 102 by the gate metal 113.

Each semiconductor layer 127 may have a vertical thickness between 1 nm and 5 nm. The semiconductor layers 127 may include silicon or another suitable semiconductor material. Other materials and dimensions may be utilized for the semiconductor layers 127 without departing from the scope of the present disclosure.

Although FIG. 1A illustrates a single dielectric layer 129. In practice, the dielectric layer 129 may include multiple layers of different dielectric material between the semiconductor layers 127. For example, a first dielectric layer of silicon oxide may be positioned in contact with each of the semiconductor layers 127. A second dielectric layer of silicon nitride may be positioned between upper and lower portions of the first dielectric layer. Various configurations for a dielectric barrier between the top semiconductor nanostructure 107 and the bottom semiconductor nanostructure 106 may be utilized without departing from the scope of the present disclosure.

Figure 1C:
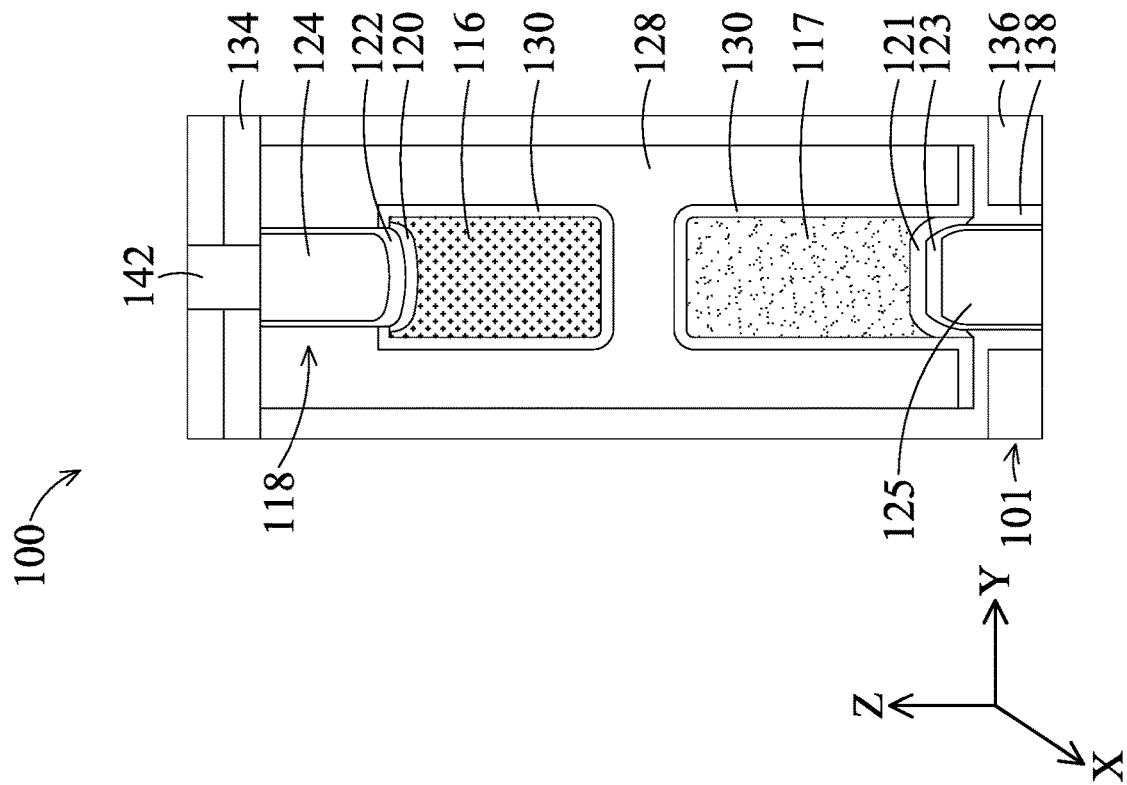
Figure 1B:
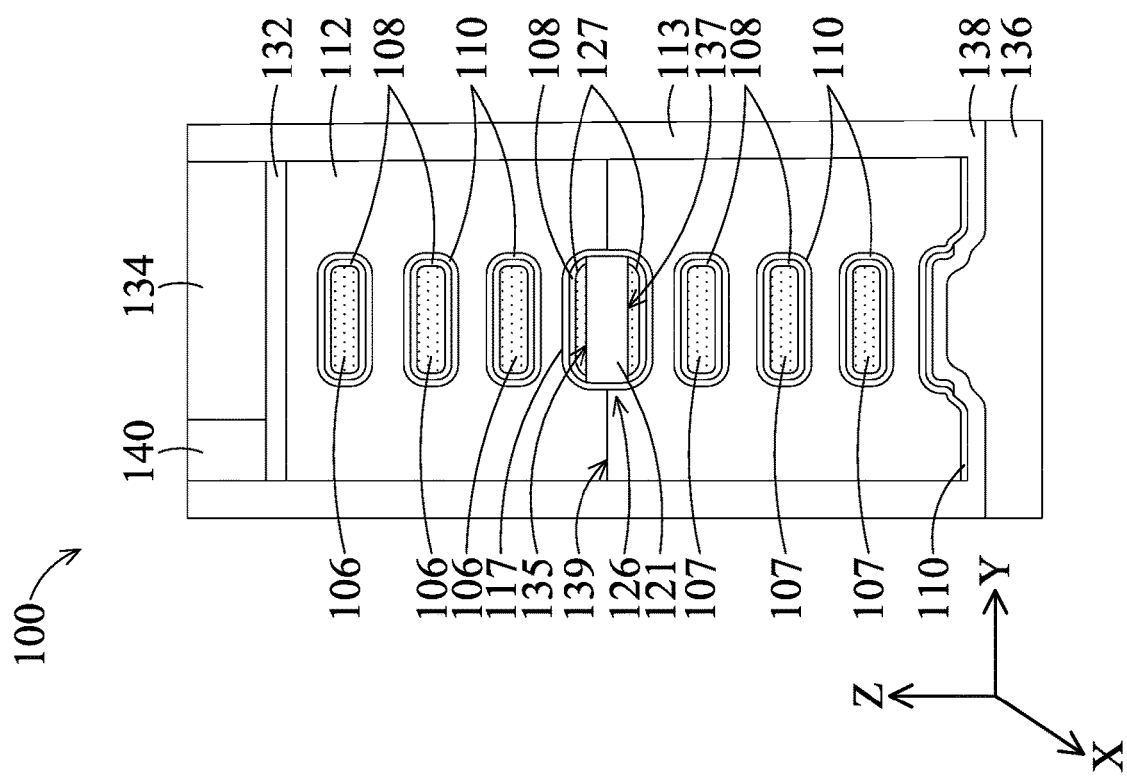

FIG. 1B is a Y-view of the integrated circuit 100 of FIG. 1A taken along cut lines 1B of FIG. 1A. Accordingly, in the view of FIG. 1B, the Y-axis is the horizontal axis, while the X-axis extends into and out of the drawing sheet. The view of FIG. 1B is a wide cut through the gate metals 112 and 113 of the transistors 104 and 105. FIG. 1B illustrates how the gate metal 112 wraps around each of the semiconductor nanostructures 106 of the transistor 104. Correspondingly, the gate metal 113 wraps around each of the semiconductor nanostructures 107 of the transistor 105.

FIG. 1B illustrates a gate contact 140 extends into the dielectric layer 134. The gate contact 140 contacts the gate cap metal 132. Accordingly, the gate contact 140 is electrically connected to the gate metals 112 and 113 of the transistors 104 and 105. The gate contact 140 can include tungsten, titanium, tantalum, aluminum, copper, tantalum nitride, titanium nitride, or other suitable conductive materials. Various configurations and materials can be utilized for the gate contact 140 without departing from the scope of the present disclosure.

FIG. 1B also illustrates the isolation structure 126 positioned between the lowest semiconductor nanostructure 106 and the highest semiconductor nanostructure 107. The isolation structure 126 includes the dielectric layer 129 and the semiconductor layers 127 above and below the dielectric layer 129. FIG. 1B also illustrates that the interfacial gate dielectric layer 108 is present on the outer surfaces of the semiconductor layers 127. The high-K gate dielectric layer 110 surrounds the isolation structure 126 in the Y-Z plane.

In some embodiments, the width of the isolation structure 126 in the Y direction is substantially equal to or slightly greater than the width of the semiconductor nanostructures 106/107 in the Y direction. The isolation structure 126 is thicker than the semiconductor nanostructures 106/107 in the Z direction. Furthermore, the isolation structure 126 is thicker in the Z direction than the portion of the gate metal 113 between the top semiconductor nanostructure 107 and the isolation structure 126. This is because the sacrificial semiconductor layer 154 (see FIG. 2A) is thicker than the sacrificial semiconductor layers 152. The gate metals 112/113 are formed in place of the sacrificial semiconductor nanostructures 152.

In some embodiments, a junction or interface of the gate metals 112/113 occurs at a vertical height corresponding to a vertical midway level of the isolation structure 126. The junction or interface of the gate metals 112/113 may occur at any vertical level between the semiconductor layers 127. Other configurations of the gate metals 112/113 and the isolation structure 126 can be utilized without departing from the scope of the present disclosure.

FIG. 1C is a cross-sectional view of the integrated circuit 100 of FIG. 1A taken along cut lines 1C of FIG. 1A. Accordingly, in the view of FIG. 1C, the Y-axis is the horizontal axis, while the x-axis extends into and out of the drawing sheet. The view of FIG. 1C is a wide cut through the source/drain regions 116 and 117 from one side of the CFET 102.

FIG. 1C illustrates that the dielectric layer 130 surrounds the source/drain regions 116 and 117 in the Y-Z plane, aside from where the source/drain contacts 118/119 are connected to the source/drain regions 116/117. FIG. 1C also illustrates the interlevel dielectric layer 128 surrounds the outer surfaces of the dielectric layer 130 and fills the space between the source/drain region 116 and the source/drain region 117. FIG. 1C also illustrates a conductive via 142 electrically connected to the source/drain contact 118 of the transistor 104. The conductive via 142 may include tungsten, titanium, aluminum, copper, titanium nitride, tantalum nitride, or other suitable conductive layers. Though not shown in FIG. 1C, a conductive via may also extend through the substrate 101 to contact the bottom of the source/drain contact 119 in order to provide electrical connection to the source/drain regions 117.

Figure 1D:
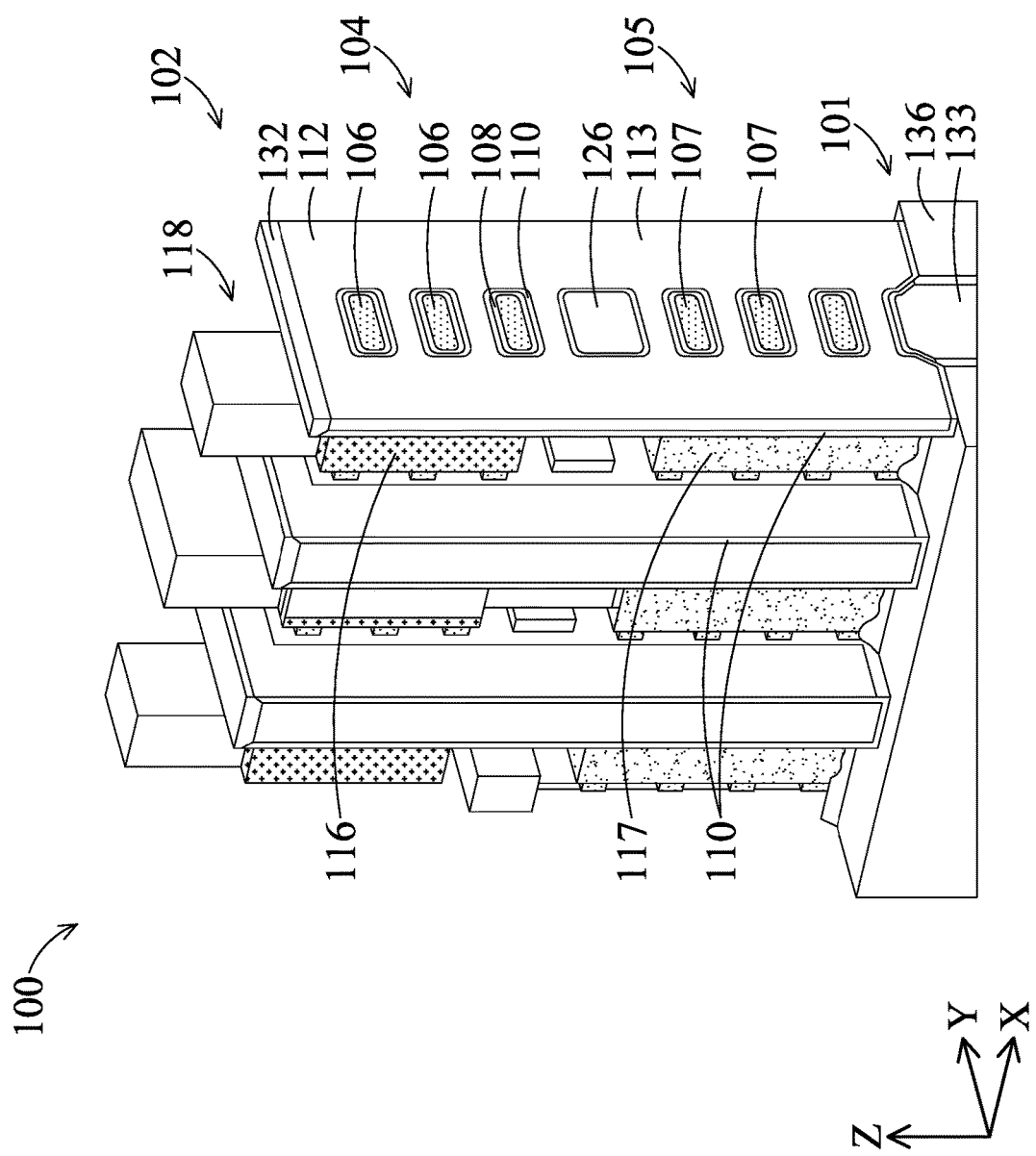

FIG. 1D is a perspective view of the integrated circuit 100 of FIG. 1A, in accordance with some embodiments. FIG. 1D does not illustrate the interlevel dielectric layer 128 or the dielectric layer 130 so that the position of the source/drain regions 116 and 117 is apparent. FIG. 1D illustrates the semiconductor nanostructures 106 and 107, the interfacial gate dielectric layer 108 and the high-K gate dielectric layer 110 surrounding the semiconductor nanostructures 106 and 107, the gate metal 112 surrounding the semiconductor nanostructures 106, and the gate metal 113 surrounding the semiconductor nanostructures 107. The isolation structure 126 is present between the lowest semiconductor nanostructure 106 and the highest semiconductor nanostructure 107. The gate cap metal 132 is visible on top of the gate metal 112. The source/drain contact 118 is coupled to the source/drain region 116. FIG. 1D also illustrates that the high-K dielectric layer 110 is also present on sidewalls of the gate metals 112 and 113 and on the bottom of the gate metal 113. The substrate 101, may also include a semiconductor layer 133, although at this point in processing the semiconductor layer 133 may also be entirely removed after forming backside conductive structures. Various other configurations of the integrated circuit 100 can be utilized without departing from the scope of the present disclosure.

Figure 2B:
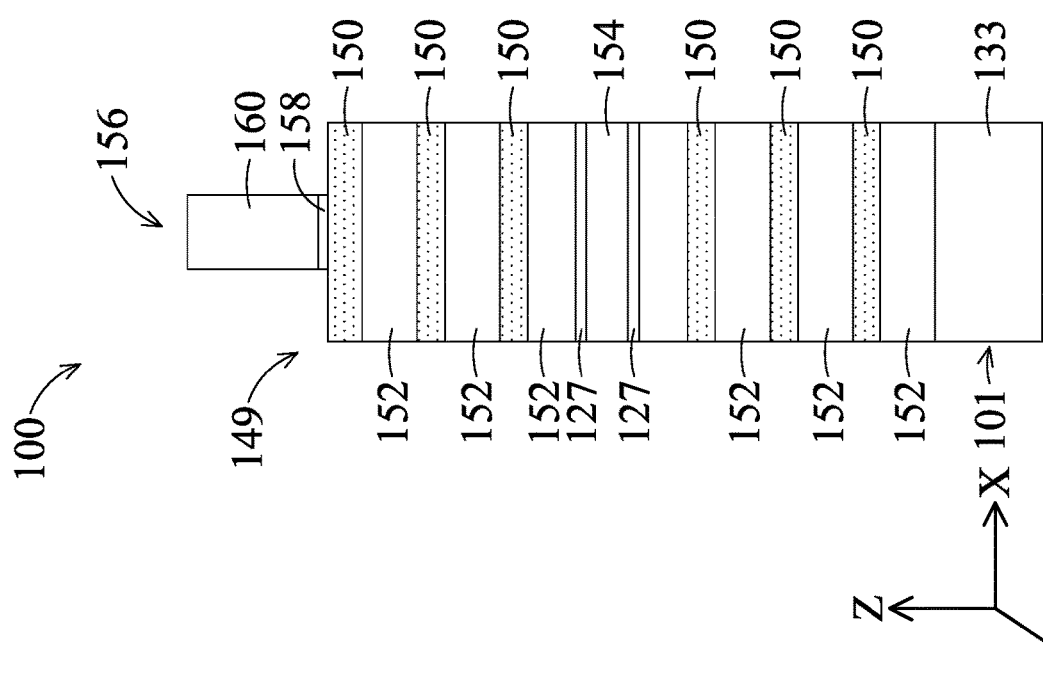
FIGS. 2A-2N are cross-sectional views of an integrated circuit at various stages of processing, in accordance with some embodiments.
Figure 2A:
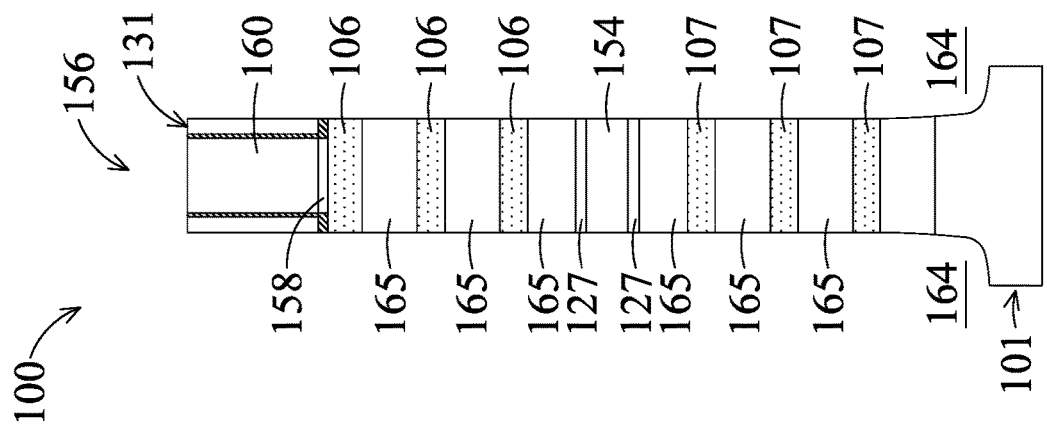
Figure 2D:
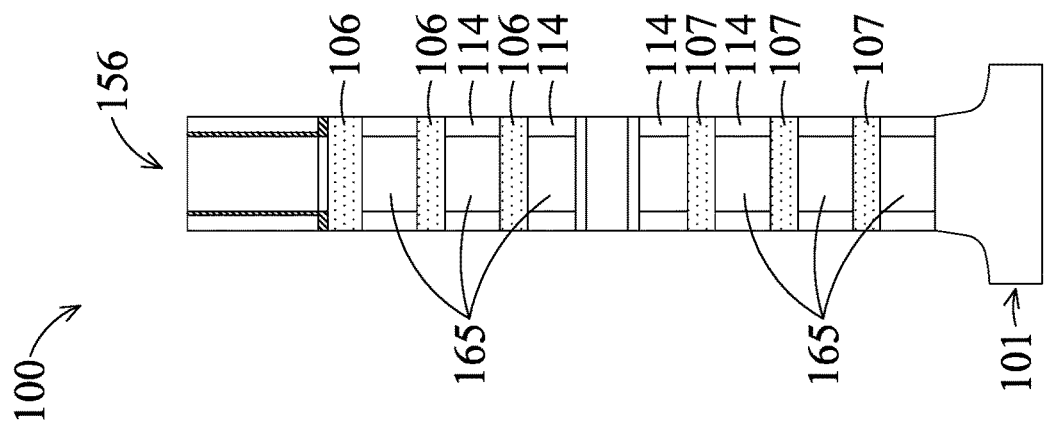
Figure 2C:
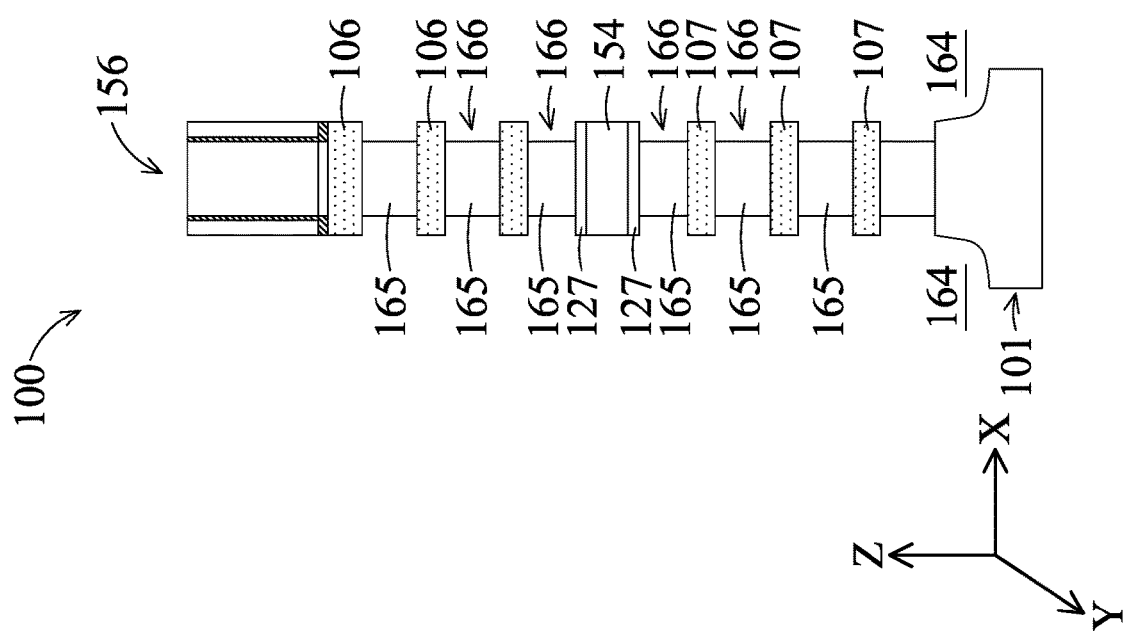
Figure 2F:
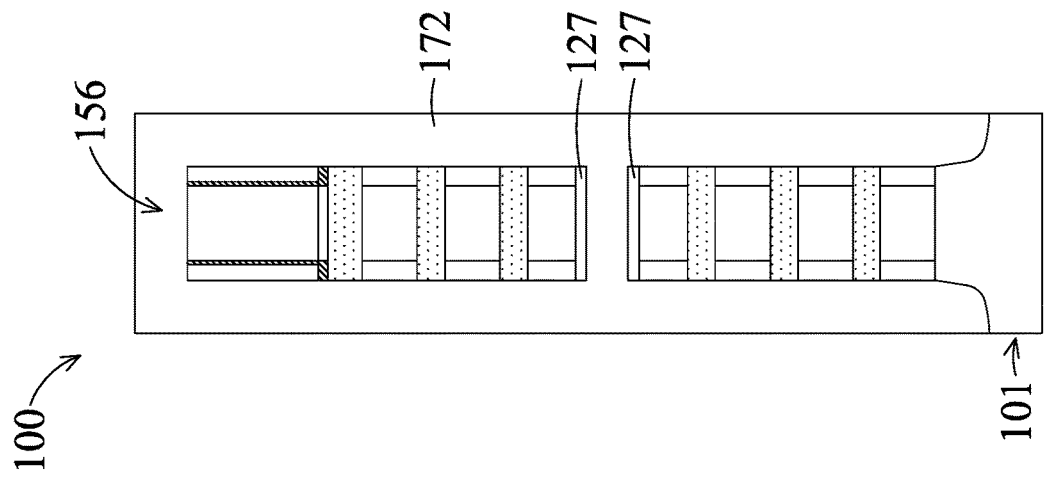
Figure 2E:
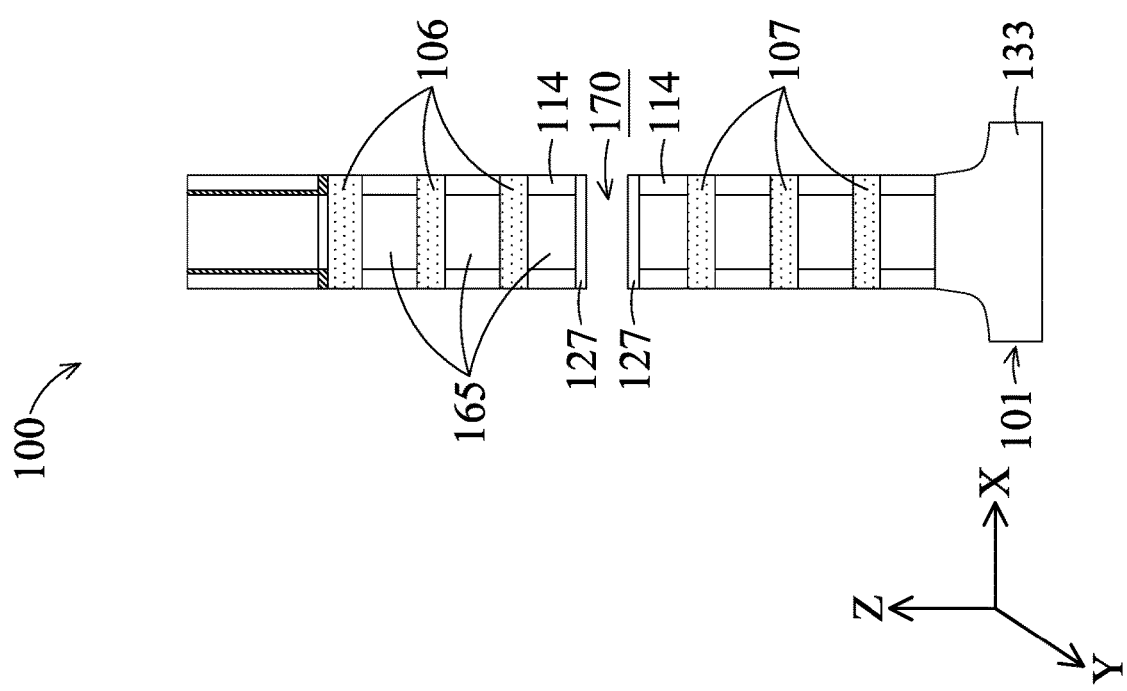
Figure 2H:
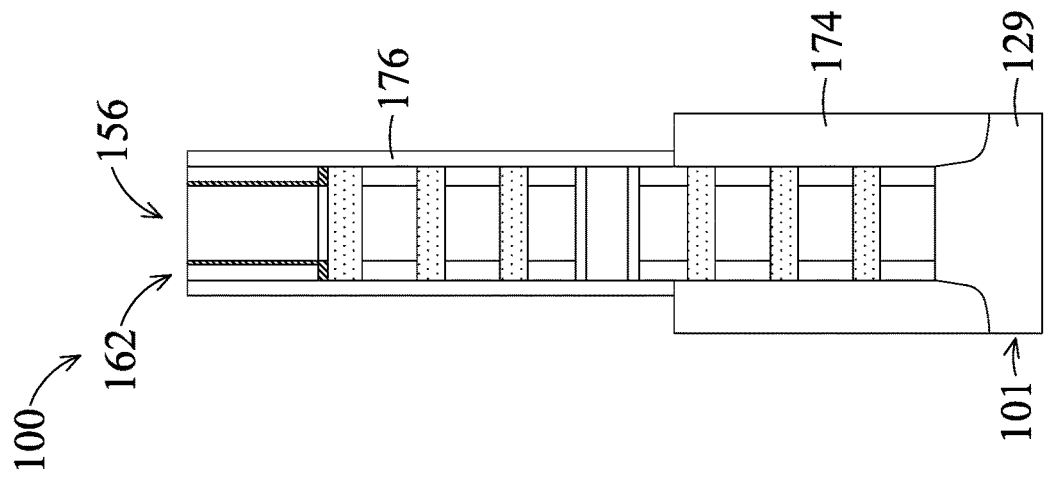
Figure 2G:
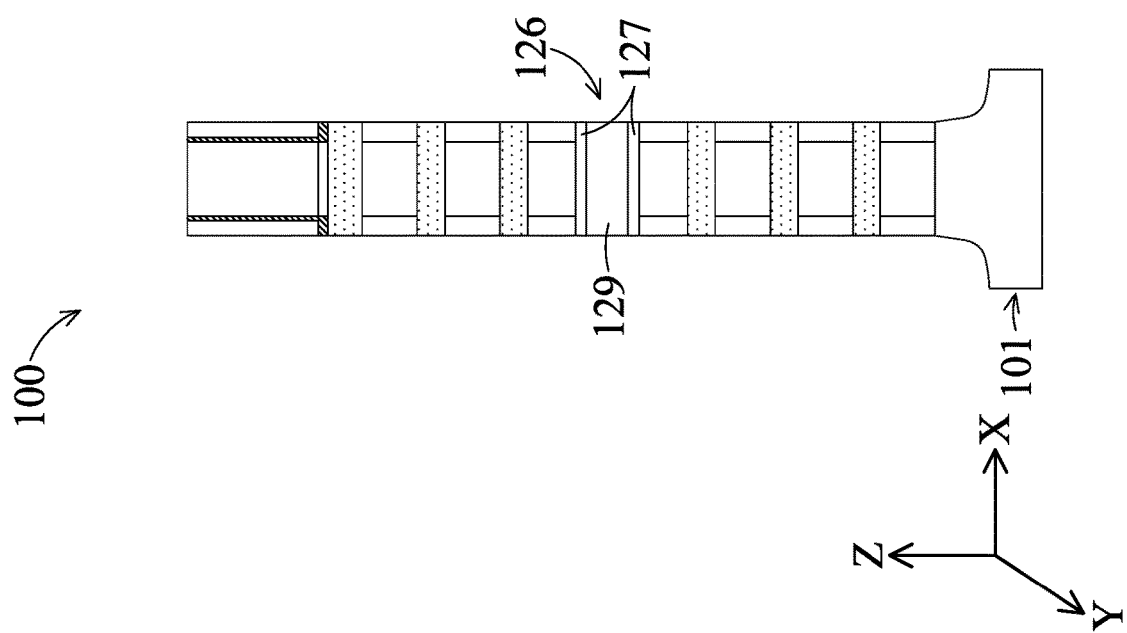
Figure 2J:
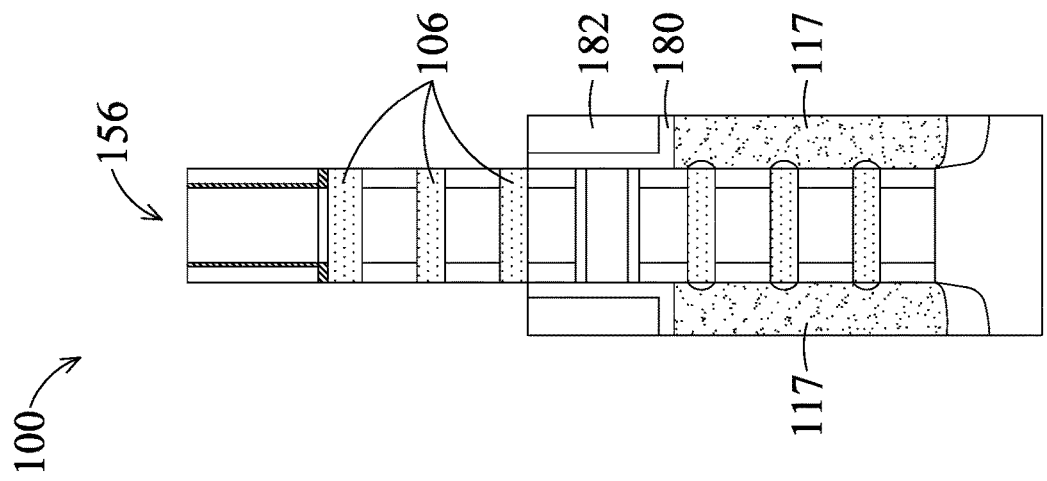
Figure 2I:
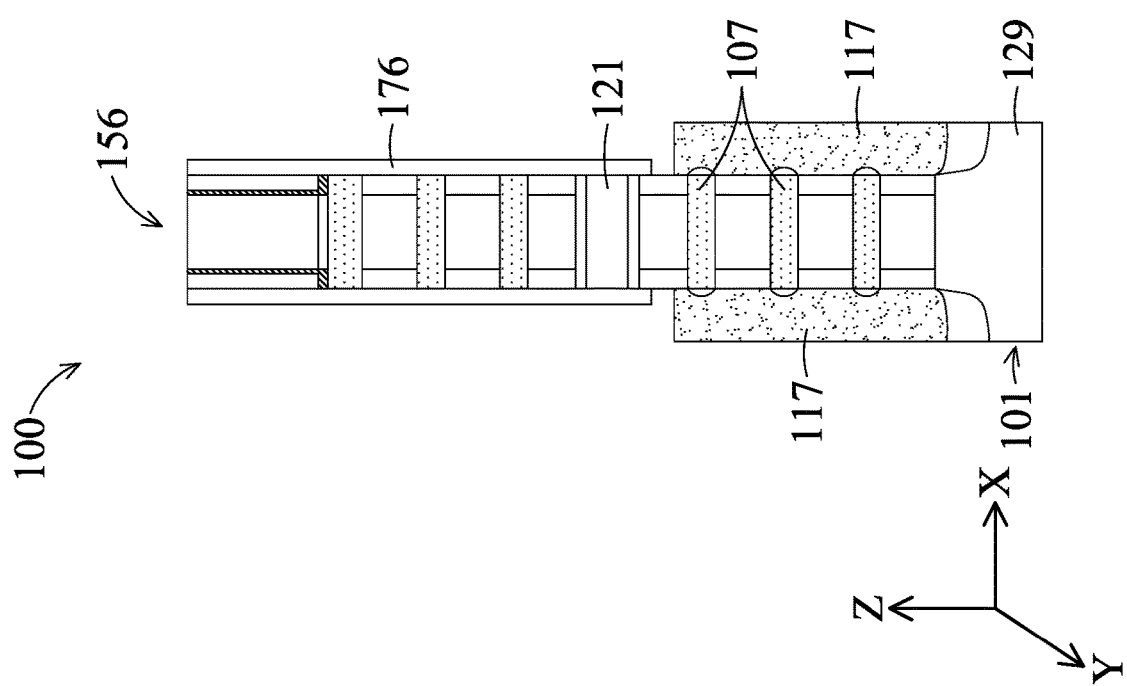
Figure 2L:
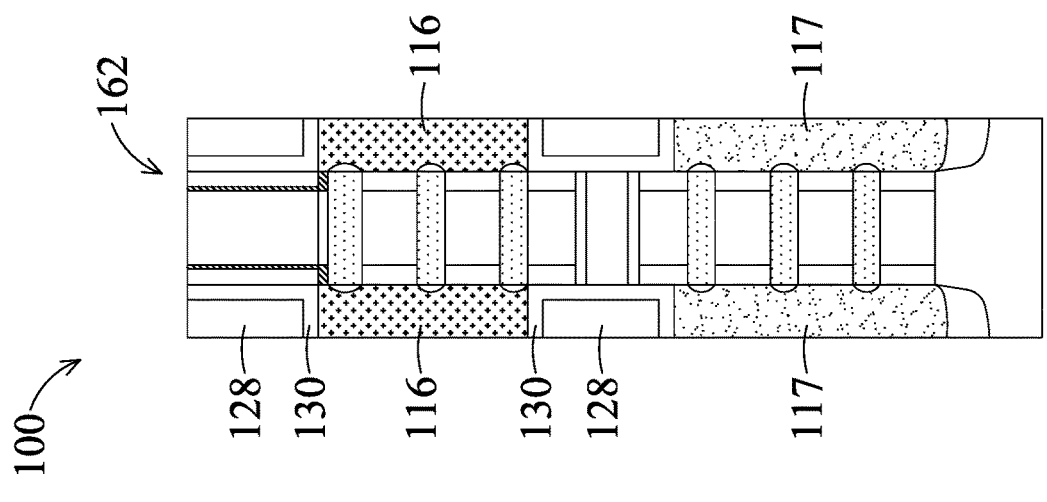
Figure 2K:
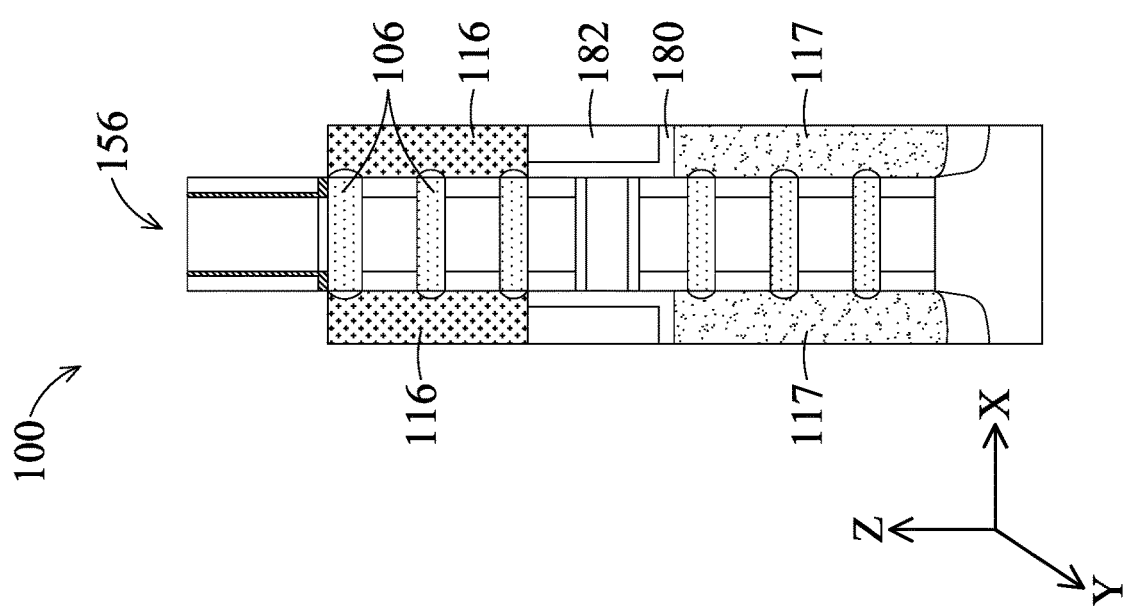
Figure 2N:
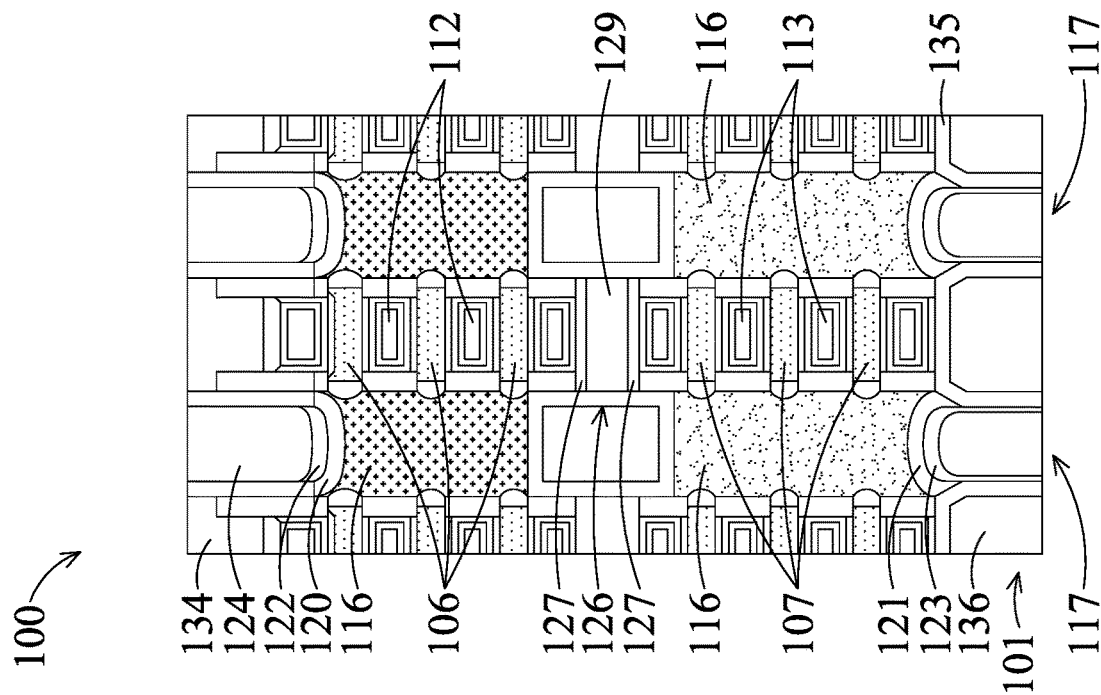

FIGS. 2A-2N are cross-sectional views of an integrated circuit 100 at various stages of processing, in accordance with some embodiments. FIGS. 2A-2N illustrate a process for forming a CFET 102, in accordance with some embodiments. As will be described in further detail below, an isolation structure can be formed between stacked transistors 104/105 in order to ensure desired characteristics of the CFET 102.

FIG. 2A is a cross-sectional X-view of an integrated circuit 100, in accordance with some embodiments. In FIG. 2A, a semiconductor fin 149 includes a plurality of semiconductor layers 150, a plurality of sacrificial semiconductor layers 152 stacked on the substrate 101, semiconductor layers 127, and a special sacrificial semiconductor layer 154. The sacrificial semiconductor layers 152 are positioned between the semiconductor layers 150. As will be described in more detail below, the semiconductor layers 150 will eventually be patterned to form the semiconductor nanostructures 106/107 that corresponds to the channel regions of the complementary transistors 104/105 that collectively make up the CFET 102. Accordingly, the semiconductor layers 150 can have materials and vertical thicknesses described in relation to the semiconductor nanostructures 106/107 of FIGS. 1A and 1B. The semiconductor fin 149 may be termed a hybrid nanostructure, or may be patterned to form a hybrid nanostructure as will be described in more detail below.

The sacrificial semiconductor layers 152 includes a semiconductor material different than the semiconductor material of the semiconductor layers 150. In particular, the sacrificial semiconductor layers 152 include materials that are selectively etchable with respect to the material of the semiconductor layers 150. As will be described in further detail below, the sacrificial semiconductor layers 152 will eventually be patterned to form sacrificial semiconductor nanostructures. The sacrificial semiconductor nanostructures will eventually be replaced by gate metals positioned between the semiconductor nanostructures 106. In one example, the sacrificial semiconductor layers 152 can include a single crystalline semiconductor material such as, but not limited to Si, Ge, SiGe, GaAs, InSb, GaP, GaSb, InAlAs, InGaAs, GaSbP, GaAsSb and InP. In an example process described herein, the sacrificial semiconductor layers 152 include SiGe, while the semiconductor layers 150 include Si. Other materials and configurations can be utilized for the sacrificial semiconductor layers 152 and the semiconductor layers 150 without departing from the scope of the present disclosure.

In some embodiments, each semiconductor layer 150 includes intrinsic silicon and each sacrificial semiconductor layer 152 includes silicon germanium. The sacrificial semiconductor layers may have a relatively low germanium concentration of between 10% and 35%. A concentration in this range can provide sacrificial semiconductor layers 152 that are selectively etchable with respect to the semiconductor layers 150. In some embodiments, the semiconductor layers 150 have a thickness between 2 nm and 5 nm. In some embodiments, the sacrificial semiconductor layers 152 have a thickness between 4 nm and 10 nm. Other materials, concentrations, and thicknesses can be utilized for the semiconductor layers 150 and the sacrificial semiconductor layers 152 without departing from the scope of the present disclosure.

In some embodiments, the semiconductor fin 149 is formed by performing a series of epitaxial growth processes. A first epitaxial growth process grows the lowest sacrificial semiconductor layer 152 on the semiconductor substrate 101. A second epitaxial growth process grows the lowest semiconductor layer 150 on the lowest sacrificial semiconductor layer 152. Alternating epitaxial growth processes are performed to form the four lowest sacrificial semiconductor layers 152 and the three lowest semiconductor layers 150. Depending on the number of semiconductor nanostructures desired for the lower transistor 105 of the CFET 102, more or fewer sacrificial semiconductor layers 152 and semiconductor layers 150 can be formed.

After the semiconductor layers 150 and sacrificial semiconductor layers 152 associated with the lower transistor 105 have been formed, layers associated with the isolation structure 126 will be formed. In particular, an epitaxial growth process is performed to form the lower semiconductor layer 127. In one example, the lower semiconductor layer 127 is intrinsic silicon having a thickness between 1 nm and 3 nm. After the lower semiconductor layer 127 is formed, another epitaxial growth process is performed to form a special sacrificial semiconductor layer 154. The sacrificial semiconductor layer 154 has a composition that is selectively etchable with respect to the semiconductor layers 150 and the sacrificial semiconductor layers 152. In an example in which the sacrificial semiconductor layers 152 are silicon germanium with a relatively low concentration of germanium, the sacrificial semiconductor layer 154 can include silicon germanium with a relatively high concentration of germanium. In some embodiments, the concentration of germanium in the sacrificial semiconductor layer 154 is greater than 50%.

In some embodiments, the concentration of germanium in the sacrificial semiconductor layer 154 is at least an additional 25% above the concentration of germanium in the sacrificial semiconductor layers 152. For example, if the sacrificial semiconductor layers 152 have a germanium concentration of 35%, then the sacrificial semiconductor layer 154 will have a germanium concentration greater than or equal to 60%. In some embodiments, the concentration of germanium in the sacrificial semiconductor layer 154 is greater than the concentration of germanium in the sacrificial semiconductor layers 152 by a factor of 2-5. In some embodiments, the germanium concentration of the sacrificial semiconductor layer 154 is less than or equal to 80%. The sacrificial semiconductor layers 154 may have a thickness between 5 nm and 25 nm and a length between 15 nm and 30 nm. The thickness of the sacrificial semiconductor layer 154 is greater than the thickness of the sacrificial semiconductor layers 152. The thickness of the sacrificial semiconductor layers 152 is greater than the thickness of the semiconductor layer 150. Other compositions, materials, and thicknesses can be utilized for the sacrificial semiconductor layer 154 without departing from the scope of the present disclosure.

After formation of the sacrificial semiconductor layer 154, an epitaxial growth process is performed to form the upper semiconductor layer 127 on the sacrificial semiconductor layer 154. The upper semiconductor layer 127 may have a composition thickness substantially identical to the composition in thickness of the lower semiconductor layer 127.

After formation of the sacrificial semiconductor layer 154 and the upper semiconductor layer 127, the upper sacrificial semiconductor layers 152 and semiconductor layers 150 associated with the upper transistor 104 are formed. The upper sacrificial semiconductor layers 152 and semiconductor layers 150 can be formed with alternating epitaxial growth processes as described in relation to the lower semiconductor layers 150 and sacrificial semiconductor layers 152.

A dummy gate structure 156 has been formed on top of the highest semiconductor layer 150. The dummy gate structure 156 may correspond to a fin extending in the Y direction. The dummy gate structure 156 is referred to as a dummy gate structure because the gate electrodes of the transistor 102 will be formed, in part, in place of the dummy gate structure 156.

The dummy gate structure 156 includes a dielectric layer 158. The dielectric layer 158 can include a thin layer of silicon oxide grown on the top semiconductor layer 150 via chemical vapor deposition (CVD), physical vapor deposition (PVD), or atomic layer deposition (ALD). The dielectric layer 158 may have a thickness between 0.2 nm and 2 nm. Other thicknesses materials, and deposition processes can be utilized for the dielectric layer 158 without departing from the scope of the present disclosure.

The dummy gate structure 156 includes a layer of polysilicon 160. The layer of polysilicon 160 can have a thickness between 20 nm and 100 nm. The layer of polysilicon 160 can be deposited by an epitaxial growth, a CVD process, a physical vapor deposition (PVD) process, or an ALD process. Other thicknesses and deposition processes can be used for depositing the layer of polysilicon 160 without departing from the scope of the present disclosure.

The dummy gate structure 156 may also include one or more additional dielectric layers above the layer of polysilicon 160. Various configurations and materials can be utilized for the dummy gate structure 156 without departing from the scope of the present disclosure.

FIG. 2B is an X-view of the integrated circuit 100, in accordance with some embodiments. In FIG. 2B, a sidewall spacer 131 has been formed on sidewalls of the dummy gate structure 156. The sidewall spacer 131 may include multiple dielectric layers. Each of the dielectric layers of the sidewall spacer 131 may include silicon oxide, silicon nitride, silicon oxynitride, silicon carbonitride, silicon oxycarbonitride, fluorine-doped silicate glass (FSG), a low-K dielectric material or other dielectric materials. The dielectric layers of the sidewall spacer 131 can be deposited by CVD, PVD, ALD, or other suitable processes.

FIG. 2B is an X-view of the integrated circuit 100, in accordance with some embodiments. In FIG. 2B, source/drain trenches 164 have been formed through the semiconductor fins 149. The source/drain trenches 164 correspond to locations at which source/drain regions 116 and 117 will be formed. The etching process to form the source/drain trenches 164 etches the semiconductor layers 150, the sacrificial semiconductor layers 152, the semiconductor layers 127, and the sacrificial semiconductor layer 154 to fully define semiconductor nanostructures 106 and 107 from the semiconductor layers 150. More particularly, the etching process defines stacks of semiconductor nanostructures 106 and 107. The semiconductor nanostructures 106 correspond to the channel regions of the transistor 104. The semiconductor nanostructures 107 correspond to the channel regions of the transistor 105. The etching process also defines sacrificial semiconductor nanostructures 165 from the sacrificial semiconductor layers 152. The sacrificial semiconductor nanostructures 165 are positioned between the semiconductor nanostructures 106 and between the semiconductor nanostructures 107. The source/drain trenches 164 extend into the semiconductor substrate 101.

The etching process can include one or more anisotropic etching processes that selectively etch the materials of the semiconductor layers 150 and sacrificial semiconductor layers 152 in the vertical direction. The etching process may include a single step or multiple steps. The etching process may include one or more timed etches. Other types of etching processes can be utilized without departing from the scope of the present disclosure.

FIG. 2C is an X view of the integrated circuit 100, in accordance with some embodiments. In FIG. 2C, a recess step has been performed to recess the sacrificial semiconductor nanostructures 165. The recessing process removes outer portions of the sacrificial semiconductor nanostructures 165 without entirely removing the sacrificial semiconductor nanostructures 165. The recessing process can be performed with an isotropic etch that selectively etches the material of the sacrificial semiconductor nanostructures 165 with respect to the materials of the semiconductor nanostructures 106/107, the sacrificial semiconductor layer 154, and the substrate 101. The isotropic etching process can include a timed etching process. The duration of the etching process is selected to remove only a portion of the sacrificial semiconductor nanostructures 165 without entirely removing the sacrificial semiconductor nanostructures 165. The result of the etching process is that recesses 166 are formed in the sacrificial semiconductor nanostructures 165.

The etching process can include a dry etch with a gas that is a mixture of $SF_6$, $H_2$, and $CF_4$. The etching process may etch the sacrificial semiconductor nanostructures 165 at a rate that is greater than 10 times the rate at which the sacrificial semiconductor layer 154 is etched. Other etchants and etching processes can be utilized without departing from the scope of the present disclosure.

FIG. 2D is an X view of the integrated circuit 100, in accordance with some embodiments. In FIG. 2D, inner spacers 114 have been formed in the recesses 166. The inner spacers 114 can be formed by depositing a dielectric layer on the exposed sidewalls of the semiconductor nanostructures 106/107, on the bottom of the source/drain trenches 164, and in the recesses 166 formed in the sacrificial semiconductor nanostructures 165. The dielectric layer can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. The dielectric layer can be formed by CVD, PVD, ALD, or via another process. The lateral thickness of the dielectric layer may be between 2 nm and 10 nm. Other thicknesses, materials, and deposition processes can be utilized for the dielectric layer without departing from the scope of the present disclosure.

An etching process is then performed to remove portions of the dielectric layer. The etching process defines inner spacers 114. The etching process can include an isotropic etching process that etches in all directions. The isotropic etching process is timed so that the dielectric layer is removed at all locations except the locations of increased lateral thickness resulting from the recesses 166 in the sacrificial semiconductor nanostructures 165. The result is that the inner spacers 114 remain at the recesses 166 in the sacrificial semiconductor nanostructures 165. Other processes can be utilized to form the inner spacers 114 without departing from the scope of the present disclosure.

FIG. 2E is an X view of the integrated circuit 100, in accordance with some embodiments. In FIG. 2E, and etching process has been performed to remove the sacrificial semiconductor layer 154 from between the semiconductor layers 127. The etching process can include an isotropic etch that selectively etches the sacrificial semiconductor layer 154 with respect to the semiconductor nanostructures 106/107, the semiconductor substrate 101, and the sacrificial semiconductor layers 165. Because the sacrificial semiconductor layer 154 has a significantly different concentration of germanium with respect to the sacrificial semiconductor nanostructures 165, the sacrificial semiconductor layer 154 can be etched selectively with respect to the sacrificial semiconductor nanostructures 165 and the semiconductor nanostructures 106/107. In some embodiments, the etching process can include a dry etch process using an etchant of $CF_4$ or HBr gas that etches the sacrificial semiconductor layer 154 at a rate that is higher than 10 times the etching rate of the semiconductor nanostructures 106/107 and the semiconductor layers 127. Other etching processes can be utilized without departing from the scope of the present disclosure.

The result of the etching process in FIG. 2E is that a void 170 is formed between the semiconductor layers 127. As will be described in more detail below, a dielectric layer 129 will be formed in place of the void 170.

FIG. 2F is an X view of the integrated circuit 100, in accordance with some embodiments. In FIG. 2F, a dielectric layer 172 has been deposited. The dielectric layer 172 is deposited in the void 170 between the semiconductor layers 127, and the source/drain trenches 164, and on the dummy gate structure 156. The dielectric layer 172 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. The dielectric layer 172 can be deposited using CVD, ALD, or PVD. Other materials and deposition processes can be used for the dielectric layer 172 without departing from the scope of the present disclosure.

FIG. 2G is an X view of the integrated circuit 100, in accordance with some embodiments. In FIG. 2G, the dielectric layer 129 has been formed between the semiconductor layers 127. The dielectric layer 129 is formed by performing an etching process on the dielectric layer 172. The etching process can include an anisotropic etch that etches selectively in the downward direction. This etching process removes the dielectric layer 172 from all locations except between the semiconductor layers 127. Accordingly, the dielectric layer 129 is a remnant of the dielectric layer 172. The dielectric layer 129 and the semiconductor layers 127 may collectively correspond to a hybrid nanosheet that will help provide improved gate metal characteristics, as will be described in more detail below While FIG. 2G illustrates the dielectric layer 129 having substantially vertical sidewalls, in practice, the dielectric layer 129 may include concave sidewalls. This can be result of the anisotropic etching process. This may occur because an anisotropic etching processes may not be perfectly anisotropic. For example, an anisotropic etching process may etch in the downward direction at a rate between 10 and 100 times greater than in lateral directions. Though comparatively small, some etching in the lateral direction occurs, thereby generating concave recesses in the dielectric layer 129. The dielectric layer 129 can have various other configurations without departing from the scope of the present disclosure.

FIG. 2H is an X view of the integrated circuit 100, in accordance with some embodiments. In FIG. 2H, a layer of polymer material 174 has been deposited in the source/drain trenches 164. Alternatively, the polymer material 174 may be replaced by a non-polymer, dielectric material. After deposition of the polymer material 174, an etch-back process is performed to reduce the height of the polymer material 174 to a level below the lower semiconductor layer 127.

In FIG. 2H, a dielectric layer 176 has been deposited on the polymer material 174, and on sidewalls of the dielectric layer 129, the inner spacers 114, the nanostructures 106, and the sidewall spacers 131. In some embodiments, the dielectric layer 176 includes $Al_2O_3$. The dielectric layer 176 can be deposited by CVD, PVD, or ALD. Other materials and processes can be utilized for the dielectric layer 176 without departing from the scope of the present disclosure. After deposition of the dielectric layer 176, an anisotropic etching process is performed to remove the dielectric layer 176 from horizontal surfaces of the polymer material 174 and the dummy gate structure 156.

FIG. 2I is an X view of the integrated circuit 100, in accordance with some embodiments. In FIG. 2I, the polymer material 174 has been removed. Removal of the polymer material 174 exposes the sidewalls of the semiconductor nanostructures 107 and the semiconductor substrate 101. In FIG. 2I, source/drain regions 117 have been formed in the source/drain trenches 164 at the locations not covered by the dielectric layer 176. The source/drain regions 117 can be formed by an epitaxial growth from the semiconductor nanostructures 107 and from the semiconductor substrate 101. The source/drain regions 117 include a semiconductor material. The semiconductor material can include a same semiconductor material as the semiconductor nanostructures 107. Alternatively, the semiconductor material of the source/drain regions 117 can be different than the semiconductor material of the semiconductor nanostructures 107. The source/drain regions 117 may be doped in situ with dopant atoms during the epitaxial growth process. In the example in which the lower transistor 105 is a P-type transistors, the source/drain regions 117 may be doped in situ with P-type dopant atoms. The P-type dopant atoms can include boron or other P-type dopant atoms.

FIG. 2J is an X view of the integrated circuit 100, in accordance with some embodiments. In FIG. 2J, the dielectric layer 176 has been removed. A dielectric layer 180 has been deposited. A layer of polymer material 182 has also been deposited. The dielectric layer 180 can include a same material as the dielectric layer 176. The polymer material 182 can have a same material as the polymer material 174. An etch-back process has also been performed to reduce the height of the dielectric layer 180 and the polymer material 182 to expose the sidewalls of the semiconductor nanostructures 106.

FIG. 2K is an X view of the integrated circuit 100, in accordance with some embodiments. In FIG. 2K, source/drain regions 116 have been formed in the source/drain trenches 164 above the dielectric layer 180 and the polymer material 182. The source/drain regions 116 can be formed by an epitaxial growth from the semiconductor nanostructures 106. The source/drain regions 116 include a semiconductor material. The semiconductor material can include a same semiconductor material as the semiconductor nanostructures 106. Alternatively, the semiconductor material of the source/drain regions 116 can be different than the semiconductor material of the semiconductor nanostructures 106. The source/drain regions 116 may be doped in situ with dopant atoms during the epitaxial growth process. In the example in which the upper transistor 104 is an N-type transistor, the source/drain regions 116 may be doped in situ with N-type dopant atoms. The N-type dopant atoms can include phosphorus or other N-type dopant atoms.

FIG. 2L is an X view of the integrated circuit 100, in accordance with some embodiments. In FIG. 2L, the polymer material 182 and the dielectric layer 180 has been removed. A dielectric layer 130 has been deposited with a conformal deposition process. The dielectric layer 130 is deposited on the exposed sidewalls of the inner spacers 114, the semiconductor layers 127, and the dielectric layer 129 between the source/drain regions 116 and the source/drain regions 117. The dielectric layer 130 is also deposited on the top surface of the source/drain regions 117, the bottom, side, and top surfaces of the source/drain regions 116, and on the sidewall spacers 131 of the dummy gate structure 156. The dielectric layer 130 can be deposited by CVD, ALD, or other suitable processes. The dielectric layer 130 may include a contact-etching stop-layer (CESL). The dielectric layer 130 may include one or more of silicon oxide, silicon nitride, silicon oxynitride, silicon carbonitride, silicon oxycarbonitride, fluorine-doped silicate glass (FSG), a low-K dielectric material or other dielectric materials.

An interlevel dielectric layer 128 has been deposited covering the dielectric layer 130. The interlevel dielectric layer 128 can include one or more of silicon oxide, silicon nitride, silicon oxynitride, silicon carbonitride, silicon oxycarbonitride, fluorine-doped silicate glass (FSG), a low-K dielectric material or other dielectric materials. The interlevel dielectric layer can be deposited by CVD, PVD, or ALD. Other materials and dimensions can be utilized for the dielectric layers 128 and 130 without departing from the scope of the present disclosure.

Figure 2M:
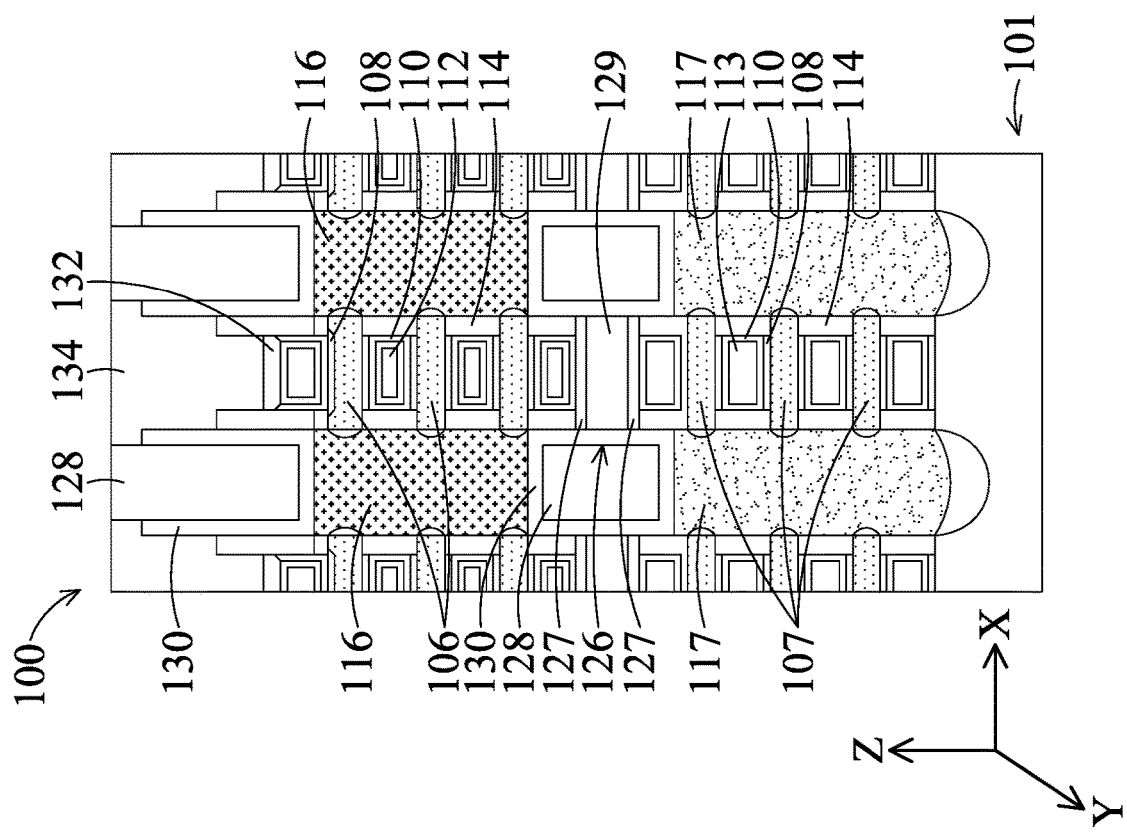

FIG. 2M is an X view of the integrated circuit 100, in accordance with some embodiments. The X view of FIG. 2M is laterally expanded with respect to FIG. 2L, thereby showing portions of laterally adjacent transistors. The dummy gate structure 156 has been removed. After removal of the dummy gate structure 156, the sacrificial semiconductor nanostructures 165 are removed with an etching process that selectively removes the sacrificial semiconductor nanostructures 165 with respect to the semiconductor nanostructures 106/107.

After removal of the sacrificial semiconductor nanostructures 165, a gap remains where the sacrificial semiconductor nanostructures 165 were. The semiconductor nanostructures 106/107 are exposed. The interfacial gate dielectric layer 108 and the high-K gate dielectric layer 110 are then deposited surrounding the semiconductor nanostructures 106/107. The interfacial gate dielectric layer 108 may include silicon oxide of a thickness between 2 Å and 10 Å. The high-K dielectric layer 110 is deposited on the interfacial gate dielectric layer 108 and may include hafnium oxide. The high-K dielectric layer may have a thickness between 5 Å and 20 Å. The materials of the gate dielectric layers 108 and 110 may be deposited by ALD, CVD, or PVD. Other structures, materials, thicknesses, and deposition processes may be utilized for the gate dielectric layer without departing from the scope of the present closure.

After deposition of the interfacial gate dielectric layer 108 and the high-K gate dielectric layer 110 around the semiconductor nanostructures 106/107, a gate metal 113 is deposited. The gate metal 113 may be deposited by PVD, CVD, ALD, or other suitable processes. The material or materials of the gate metal 113 are selected to provide a desired work function with respect to the semiconductor nanostructures 107 of the P-type transistor 105. In one example, the gate metal 113 includes titanium aluminum. However, other conductive materials can be utilized for the gate metal 113 without departing from the scope of the present disclosure.

When the gate metal 113 is initially deposited, the gate metal 113 surrounds the semiconductor nanostructures 106 and the semiconductor nanostructures 107. However, the gate metal 113 has a material that provides a desired work function for the lower transistor 105 and the gate metal 113 may not provide a desired work function for the upper transistor 104. Accordingly, an etch-back process is performed. The etch-back process removes the gate metal 113 to a level well below the lowest semiconductor nanostructure 106. In some embodiments, the etch-back process removes the gate metal 113 to a level that is about the vertical middle of the dielectric layer 129.

Because the dielectric layer 129 is present, the etch-back process can have a duration that reliably removes all of the gate metal 113 from directly between the dielectric layer 129 and the lowest semiconductor nanostructure 106, without removing the gate metal 113 from between the highest semiconductor nanostructure 107 and the dielectric layer 129. The result is that the gate metal 113 cannot interfere with the work function of the upper transistor 104.

After the etch-back process of the gate metal 113, a gate metal 112 is deposited. The gate metal 112 can be deposited using ALD, PVD, CVD, or other suitable deposition processes. In one example, the gate metal 112 includes titanium nitride. Alternatively, the gate metal 112 can include any other suitable conductive material. The gate metal 112 surrounds the semiconductor nanostructures 106. In particular, the gate metal 112 is in contact with the high-K gate dielectric 110 around the semiconductor nanostructures 106. The material of the gate metal 112 is selected to provide a desired work function for the transistor 104.

After deposition of the gate metal 112, an etch-back process is performed to reduce the height of the gate metal 112 above the top semiconductor nanostructure 106. After the etch-back process of the gate metal 112, a gate cap metal 132 is deposited on the gate metal 112. The gate cap metal 132 can include tungsten, fluorine-free tungsten, or other suitable conductive materials. The gate cap metal 132 can be deposited by PVD, CVD, ALD, or other suitable deposition processes. The gate cap metal 132 may have a vertical thickness between 1 nm and 10 nm. Other dimensions can be utilized without departing from the scope of the present disclosure.

After deposition of the gate cap metal 132, a dielectric layer 134 is deposited. The dielectric layer 134 can include silicon oxide, silicon nitride, silicon oxynitride, silicon carbonitride, silicon oxycarbonitride, fluorine-doped silicate glass (FSG), a low-K dielectric material or other dielectric materials. The dielectric layer 134 can be deposited by PVD, CVD, ALD, or other suitable deposition processes.

FIG. 2N is an X view of the integrated circuit 100, in accordance with some embodiments. In FIG. 2N, source/drain contacts 118 have been formed. Prior to formation of the source/drain contacts 118, the source/drain regions 116 may be exposed by etching through the dielectric layers 128 and 130 above the source/drain regions 116.

The source/drain contacts 118 may include silicide 120. The silicide 120 is formed at the top of the source/drain regions 116. The silicide 120 can include titanium silicide, aluminum silicide, nickel silicide, tungsten silicide, or other suitable silicides. The source/drain contacts 118 may also include a conductive layer 122 positioned on the silicide 120. The conductive layer can include titanium nitride, tantalum nitride, titanium, tantalum, or other suitable conductive materials. The source/drain contacts 118 may also include a conductive layer 124 on the conductive layer 122. The conductive layer 124 can include a conductive material such as tungsten, cobalt, ruthenium, titanium, aluminum, tantalum, or other suitable conductive materials. Other materials and configurations can be utilized for the source/drain contacts 118 without departing from the scope of the present disclosure. After formation of the source/drain contacts 118, a chemical mechanical planarization (CMP) process may be performed.

After formation of the source/drain contacts 118, source/drain contacts 119 may be formed. Forming the source/drain contacts 119 may include flipping the integrated circuit 100 so that the bottom of the substrate 101 is exposed. The trenches may then be formed through the substrate 101 exposed the source/drain regions 117. The source/drain contacts 119 are then formed in the trenches through the substrate 101.

The source/drain contacts 119 may include silicide 121. The silicide 121 is formed at the bottom of the source/drain regions 117. The silicide 121 can include titanium silicide, aluminum silicide, nickel silicide, tungsten silicide, or other suitable silicides. The source/drain contacts 119 may also include a conductive layer 123 positioned on the silicide 121. The conductive layer can include titanium nitride, tantalum nitride, titanium, tantalum, or other suitable conductive materials. The source/drain contacts 119 may also include a conductive layer 125 on the conductive layer 123. The conductive layer 125 can include a conductive material such as tungsten, cobalt, ruthenium, titanium, aluminum, tantalum, or other suitable conductive materials. Other materials and configurations can be utilized for the source/drain contacts 119 without departing from the scope of the present disclosure.

After formation of the source/drain contacts 119, a CMP process may be performed. After the CMP process, the materials of the substrate 101 may be substantially removed by one or more etching processes. A dielectric layer 138 may then be deposited on the sidewalls of the source/drain contacts 119 and on the exposed portions of the integrated circuit 100. The dielectric layer 138 may include a CESL layer The dielectric layer 138 may include one or more of silicon oxide, silicon nitride, silicon oxynitride, silicon carbonitride, silicon oxycarbonitride, fluorine-doped silicate glass (FSG), a low-K dielectric material or other dielectric materials.

An interlevel dielectric layer 136 has been deposited covering the dielectric layer 138. The interlevel dielectric layer 136 can include one or more of silicon oxide, silicon nitride, silicon oxynitride, silicon carbonitride, silicon oxycarbonitride, fluorine-doped silicate glass (FSG), a low-K dielectric material or other dielectric materials. The interlevel dielectric layer can be deposited by CVD, PVD, or ALD. Other materials and dimensions can be utilized for the dielectric layers 136 and 138 without departing from the scope of the present disclosure. A CMP process may then be performed.

In FIG. 2N, the CFET 102 has been formed. The CFET 102 includes an upper transistor 104 and a lower transistor 105. A dielectric layer 129 is positioned between the lowest semiconductor nanostructure 106 and the highest semiconductor nanostructure 107. In an example given herein, the transistor 104 is an N-type transistor and the transistor 105 is a P-type transistor. However, in other embodiments the transistor 104 can be a P-type transistor and the transistor 105 can be an N-type transistor.

The integrated circuit 100 of FIG. 2N correspond substantially to the integrated circuit 100 of FIGS. 1A-1D. Accordingly, the Y-views of FIGS. 1B and 1C and the perspective view of FIG. 1D can be utilized to understand other aspects of the integrated circuit 100 of FIG. 2N.

Figure 3B:
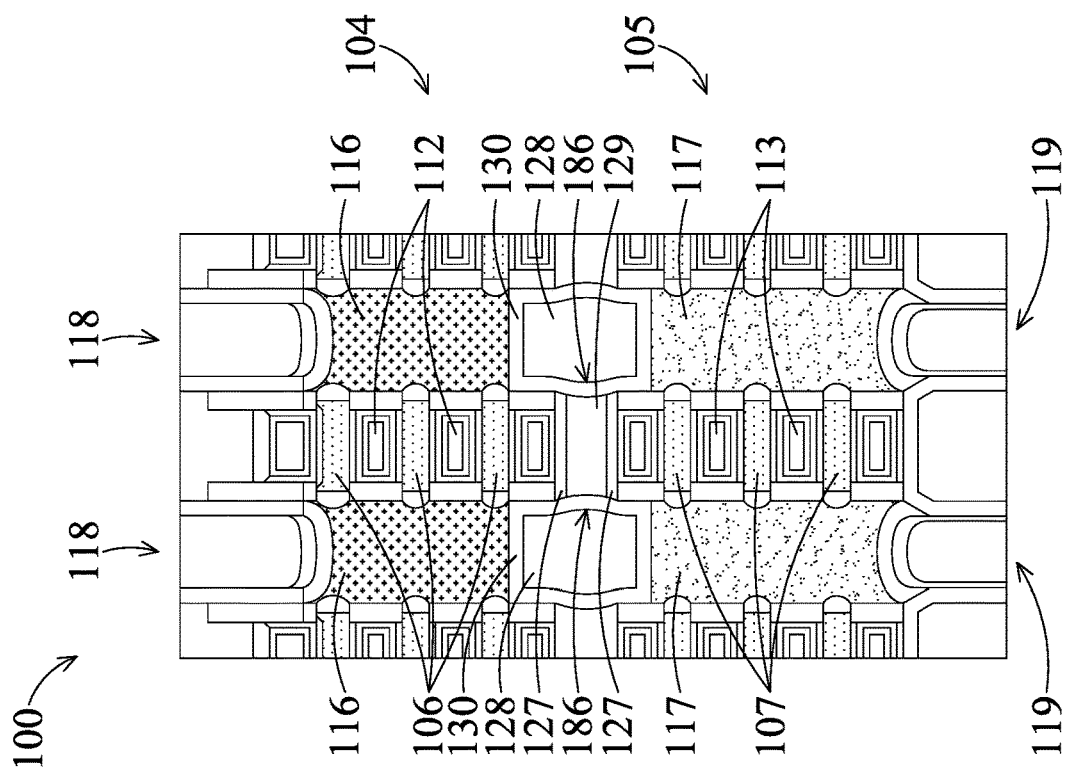
FIGS. 3A and 3B are cross-sectional views of an integrated circuit, in accordance with some embodiments.
Figure 3A:
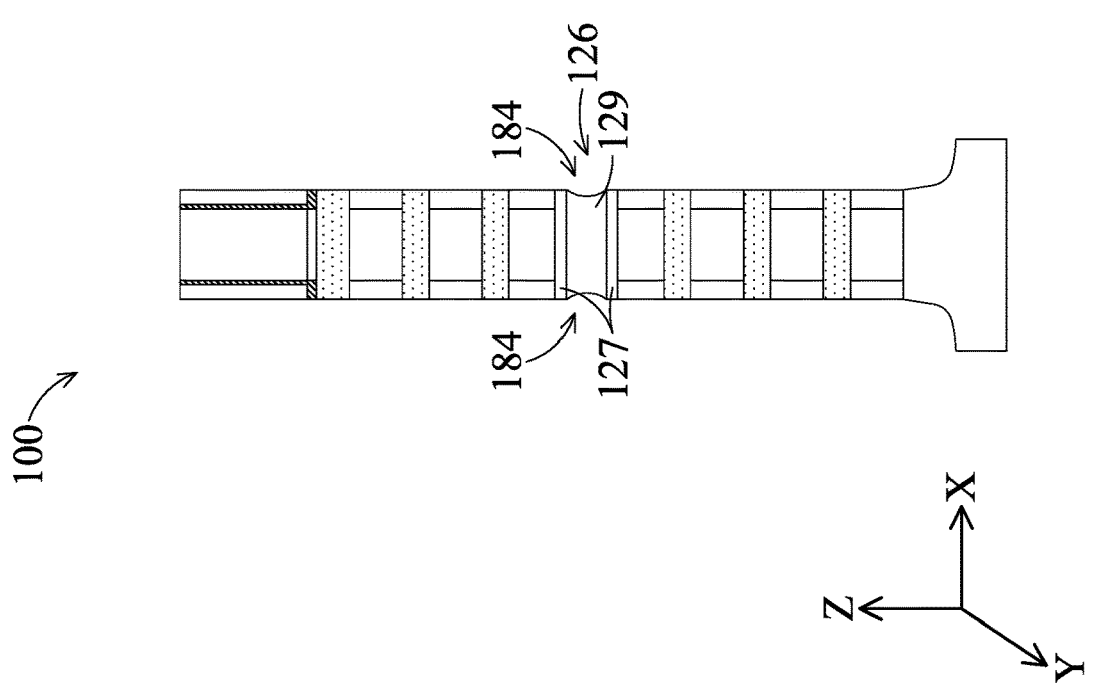

FIG. 3A is an X view of an integrated circuit 100, in accordance with some embodiments. The integrated circuit 100 is at a stage of processing substantially corresponding to the stage of processing shown in FIG. 2G. However, FIG. 3A illustrates that recesses 184 have been formed in the dielectric layer 129. The recesses correspond to concave sidewalls of the dielectric layer 129.

FIG. 3B is an X view of the integrated circuit 100, in accordance with some embodiments. The integrated circuit 100 is at a stage of processing corresponding substantially to the stage of processing shown in FIG. 2N. However, the recesses 184 in the dielectric layer 129 have resulted in protrusions 186 in the dielectric layer 130. The protrusions 186 in the dielectric layer 130 extend into the recesses 184. Accordingly, a portion of the dielectric layer 130 extends between the semiconductor layers 127.

Figure 4B:
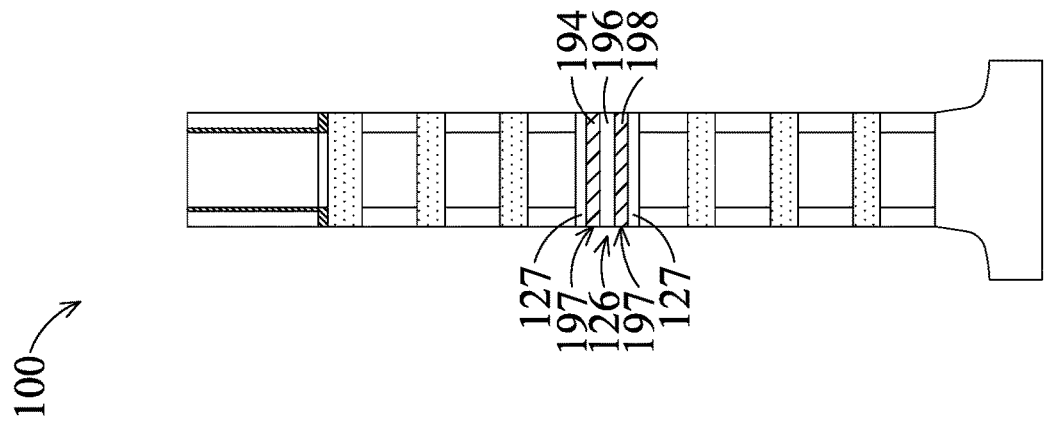
FIGS. 4A-4C are cross-sectional views of an integrated circuit, in accordance with some embodiments.
Figure 4A:
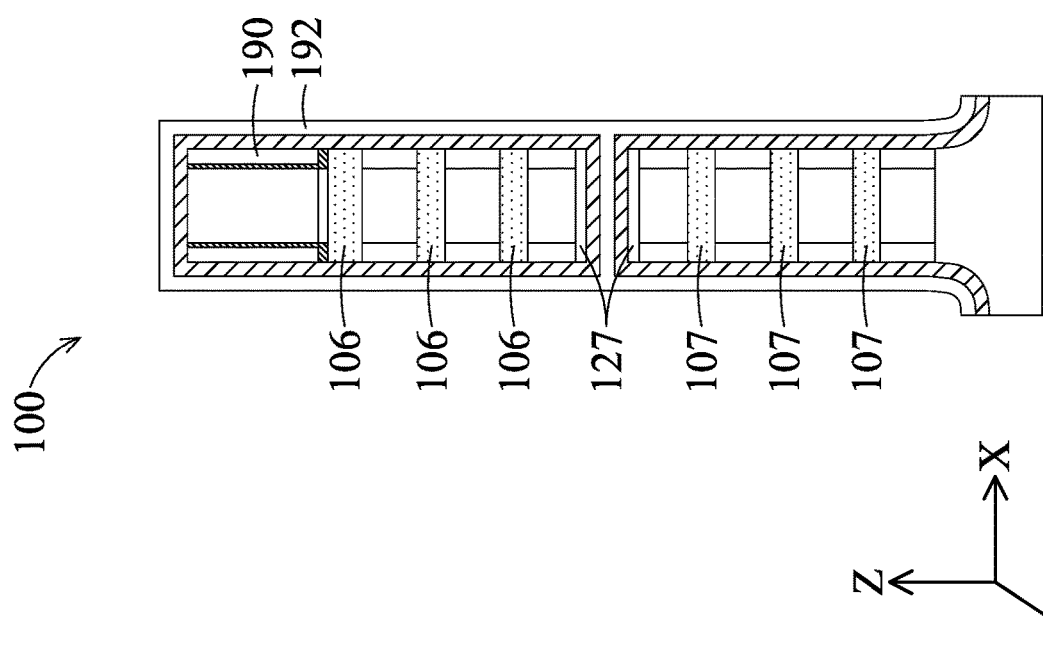

FIG. 4A is an X view of an integrated circuit 100, in accordance with some embodiments. The integrated circuit 100 is at a stage of processing substantially corresponding to the stage of processing shown in FIG. 2F. However, FIG. 4A illustrates that a first dielectric layer 190 and a second dielectric layer 192 have been deposited rather than the single dielectric layer 172 of FIG. 2F. The first dielectric layer 190 is formed on the bottom surface of the top semiconductor layer 127 and on the top surface of the bottom semiconductor layer 127. However, the dielectric layer 190 is not entirely fill the void 170. The second dielectric layer 192 is formed on the dielectric layer 190. The second dielectric layer 192 fills the remainder of the void 170.

In some embodiments, the dielectric layer 190 includes silicon oxide and the dielectric layer 192 includes silicon nitride. The dielectric layer 192 may include a harder material than the dielectric layer 190. The dielectric layers 190 and 192 may be deposited by ALD, CVD, PVD, or other suitable deposition processes. Other materials and deposition processes can be utilized for the dielectric layers 190 and 192 without departing from the scope of the present disclosure.

FIG. 4B is an X view of the integrated circuit 100, in accordance with some embodiments. In FIG. 4B, an anisotropic etching process has been performed to remove the dielectric layers 190 and 192 from all locations aside from the void 170. After the etching process, a dielectric layer 129 remains. The dielectric layer 129 includes a top layer 194, a dielectric layer 196, and a bottom layer 198. The top layer 194 and the bottom layer 198 are remnants of the dielectric layer 190. The metal layer 196 is a remnant of the dielectric layer 192. The etching process leaves relatively small recesses 197 in the ends of the dielectric layers 194, 198 of the dielectric layer 129. Because the dielectric layer 196 is more resistant to the etching process, the little or no recessing occurs in the dielectric layer 196.

Figure 4C:
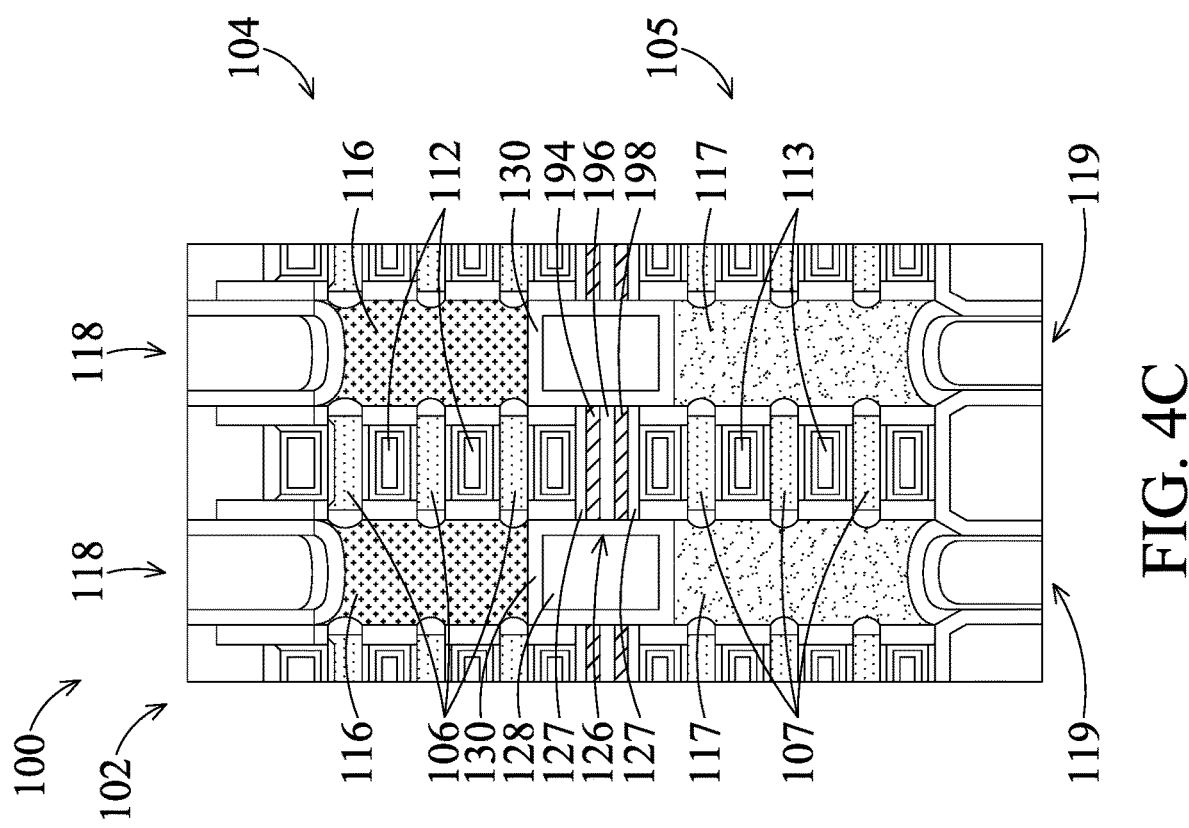

FIG. 4C is an X view of the integrated circuit 100, in accordance with some embodiments. The integrated circuit 100 is at a stage of processing corresponding substantially to the stage of processing shown in FIG. 2N. However, the dielectric layer 129 of FIG. 4C includes the three dielectric layers 194, 196, and 198.

Figure 5:
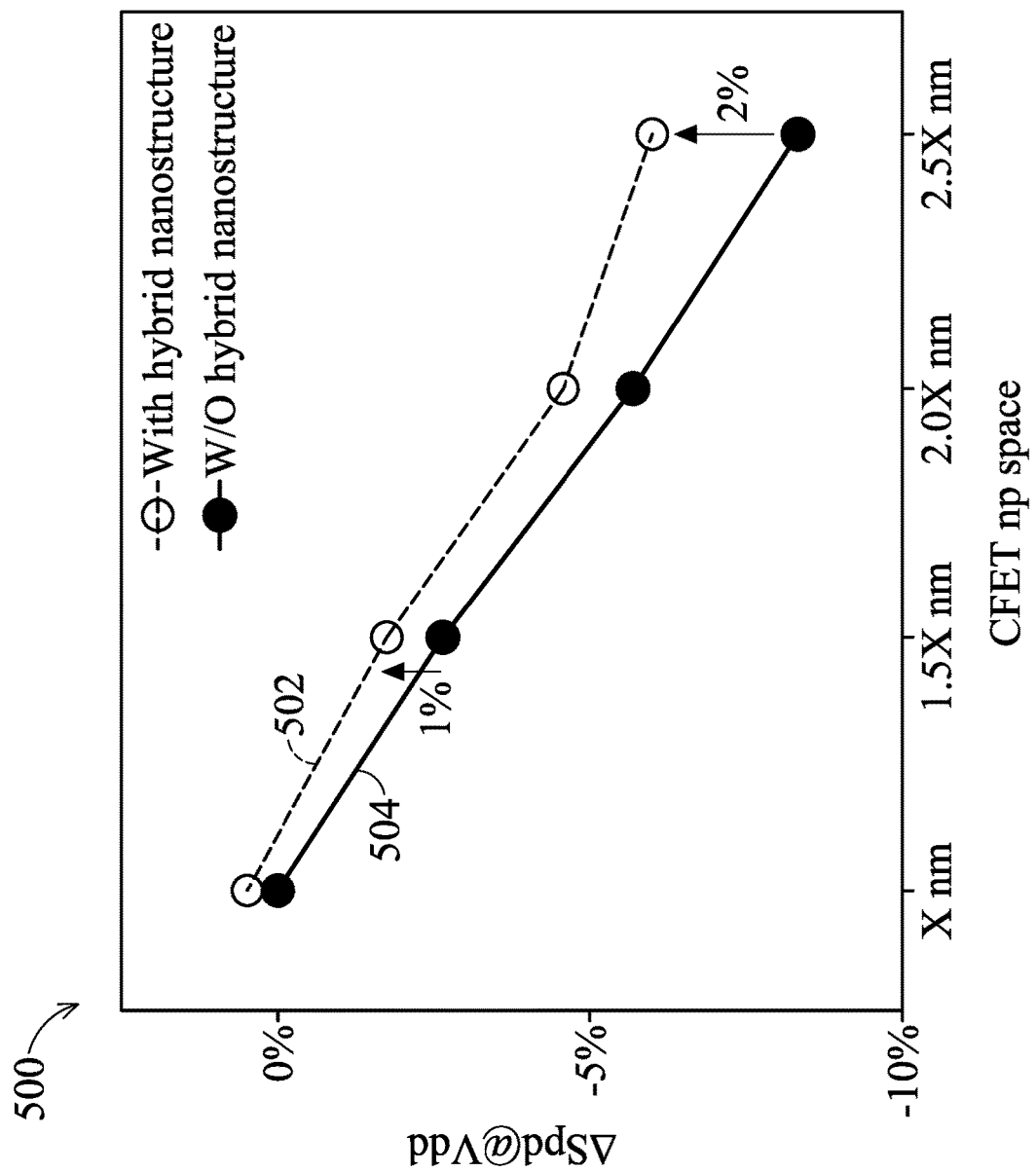
FIG. 5 is a graph of features associated with CFETs, in accordance with some embodiments.

FIG. 5 is a graph illustrating performance benefits resulting from the presence of the dielectric layer 129. Horizontal axis of the graph corresponds to the separation distance (np space) between the two transistors of the CFET 102 in nanometers, expressed in terms of X. In some embodiments, X is about 20 nm, though other values can be utilized without departing from the scope of the present disclosure. The vertical axis of the graph 500 corresponds to speed performance of the CFET at VDD. The curve 502 corresponds to a CFET 102 with the dielectric layer 129.

The curve 504 corresponds to a CFET that does not include the dielectric layer 129. In a CFET that does not include an isolation structure, such as the dielectric layer 129 between the upper and lower transistors, some of the gate metal of the lower transistor may abut the gate dielectric around the lowest nanostructure of the upper transistor. This can interfere with the work function of the upper transistor. As can be seen, at about 1.5X nm, there is a 1% difference between the curves 502 and 504. At about 2.5X nm, there is a 2% difference between the curves 502 and 504. Accordingly, the presence of the dielectric layer 129 can be very beneficial to the overall performance of a CFET 102.

Figure 6:
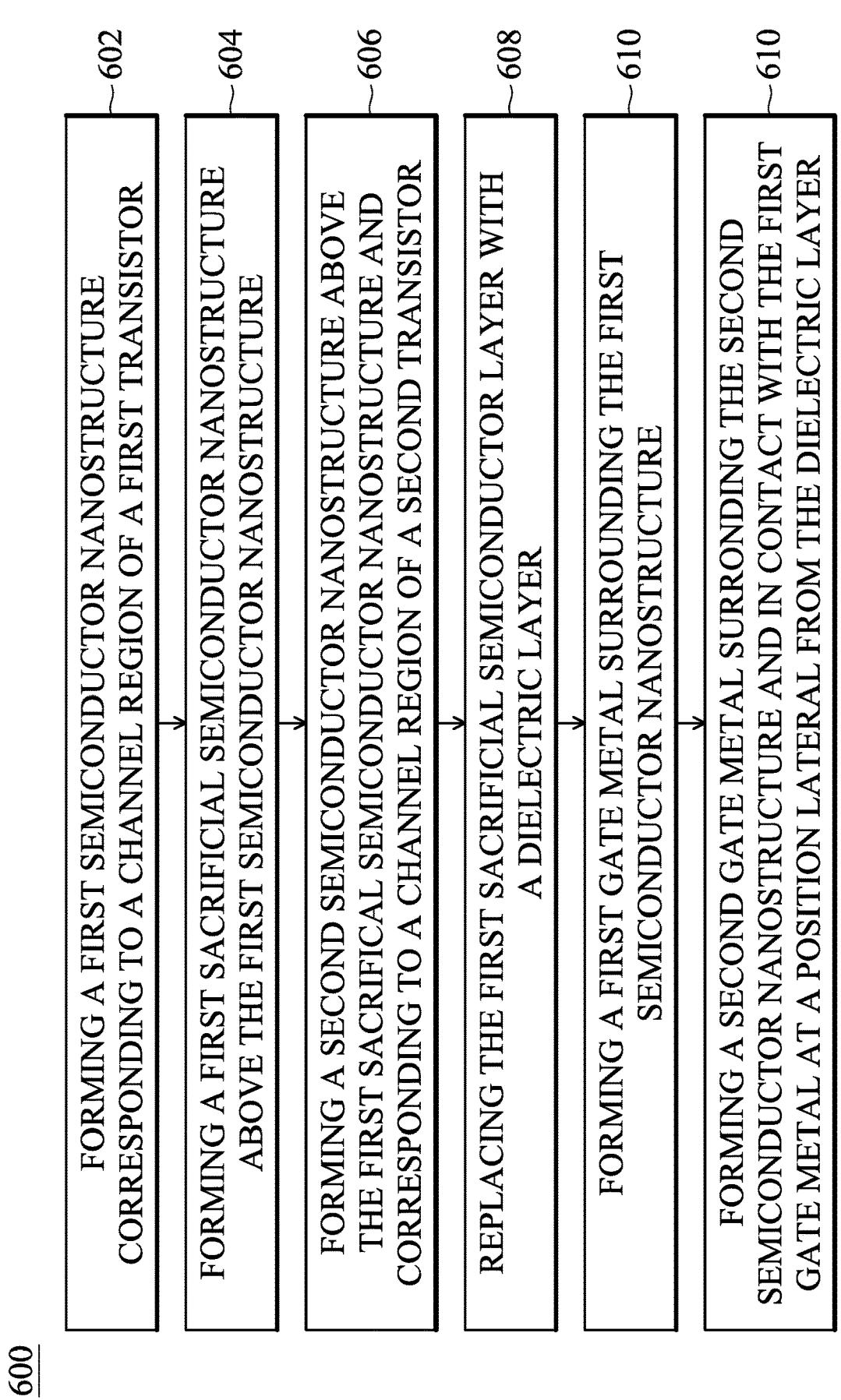
FIG. 6 is a flow diagram of a process for forming an integrated circuit, in accordance with some embodiments.

FIG. 6 is a flow diagram of a method 600, in accordance with some embodiments. The method 600 can utilize components, systems, and processes described in relation to FIGS. 1A-5. At 602, the method 600 includes forming a first semiconductor nanostructure corresponding to a channel region of a first transistor. One example of a first semiconductor nanostructure is the semiconductor Nanostructure 107 of FIG. 1A. One example of a first transistor is the transistor 105 of FIG. 1A. At 604, the method 600 includes forming a first sacrificial semiconductor nanostructure above the first semiconductor nanostructure. One example of a first sacrificial semiconductor Nanostructure is the sacrificial semiconductor Nanostructure 154 of FIG. 2A. At 606, the method 600 includes forming a second semiconductor nanostructure above the first sacrificial semiconductor nanostructure and corresponding to a channel region of a second transistor. One example of a second semiconductor Nanostructure is the second semiconductor Nanostructure 106 of FIG. 1A. At 608, the method 600 includes replacing the first sacrificial semiconductor nanostructure with a dielectric layer. One example of a dielectric layer is the dielectric layer 129 of FIG. 1A. At 610, the method 600 includes forming a first gate metal surrounding the first semiconductor nanostructure. One example of a first gate metal is the gate metal 113 of FIG. 1A. At 612, the method 600 includes forming a second gate metal surrounding the second semiconductor nanostructure and in contact with the first gate metal at a position lateral from the dielectric layer. One example of a second gate metal is the gate metal 112 of FIG. 1A

Embodiments of the present disclosure provide an integrated circuit with a CFET having improved electrical characteristics. The CFET includes a first transistor stacked vertically on a second transistor. The first and second transistors each have a plurality of semiconductor nanostructures that act as the channel regions for the first and second transistors. A first gate metal surrounds the semiconductor nanostructures of the first transistor. A second gate metal surrounds the semiconductor nanostructures of the second transistor. The CFET includes an isolation structure positioned between the lowest semiconductor nanostructure of the first transistor and the highest semiconductor nanostructure of the second transistor. The presence of the isolation structure helps ensure that there will not be any undesired remnants of the gate metal of the second transistor around the lowest semiconductor nanostructure of the first transistor.

This helps ensure that the gate metal of the second transistor will not interfere with the work function of the first transistor. The result is that the threshold voltage of the first transistor will not be undesirably affected by the gate metal of the second transistor. Furthermore, the presence of the isolation structure can reduce the gate to drain capacitance of the first and second transistors. This results in better functioning CFETs, better functioning integrated circuits, and increased wafer yields.

In some embodiments, an integrated circuit includes a first transistor. The first transistor includes first semiconductor nanostructure corresponding to a channel region of the first transistor and a first gate metal surrounding the first semiconductor nanostructure. The integrated circuit includes a second transistor including a second semiconductor nanostructure above the first semiconductor nanostructure and corresponding to a channel region of the second transistor and a second gate metal surrounding the second semiconductor nanostructure. The integrated circuit includes a dielectric layer between the first semiconductor nanostructure and the second semiconductor nanostructure. The first gate metal contacts the second gate metal at a height lower than a top surface of the dielectric layer.

In some embodiments, a method includes forming a first semiconductor nanostructure corresponding to a channel region of a first transistor, forming a first sacrificial semiconductor nanostructure above the first semiconductor nanostructure, and forming a second semiconductor nanostructure above the first sacrificial semiconductor nanostructure and corresponding to a channel region of a second transistor. The method includes replacing the first sacrificial semiconductor nanostructure with a dielectric layer, forming a first gate metal surrounding the first semiconductor nanostructure, and forming a second gate metal surrounding the second semiconductor nanostructure and in contact with the first gate metal at a position lateral from the dielectric layer.

In some embodiments, an integrated circuit includes a complementary field effect transistor including a first transistor having a first semiconductor nanostructure corresponding to a channel region of the first transistor and a second transistor having a second semiconductor nanostructure above the first semiconductor nanostructure and corresponding to a channel region of the second transistor. The complementary field effect transistor includes an isolation structure including a dielectric layer between the first semiconductor nanostructure and the second semiconductor nanostructure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first transistor including:
      a first semiconductor nanostructure corresponding to a channel region of the first transistor; and
      a first gate metal surrounding the first semiconductor nanostructure;
   a second transistor including:
      a second semiconductor nanostructure above the first semiconductor nanostructure and corresponding to a channel region of the second transistor; and
      a second gate metal surrounding the second semiconductor nanostructure;
   an isolation structure including:
      a dielectric layer between the first semiconductor nanostructure and the second semiconductor nanostructure, wherein the first gate metal contacts the second gate metal at a height lower than a top surface of the dielectric layer;
a first semiconductor layer above and in contact with the dielectric layer; and
a second semiconductor layer below and in contact with the dielectric layer.

2. The integrated circuit of claim 1, wherein first and second semiconductor layers each have a vertical thickness less than a vertical thickness of the first semiconductor nanostructure.

3. The integrated circuit of claim 1 comprising a gate dielectric layer positioned on the first semiconductor nanostructure, the second semiconductor nanostructure, and the isolation structure.

4. The integrated circuit of claim 1, wherein the dielectric layer has a vertical thickness greater than a vertical thickness of the first semiconductor nanostructure.

5. The integrated circuit of claim 1, wherein the dielectric layer has concave sidewalls.

6. The integrated circuit of claim 1, wherein the dielectric layer includes:
a first dielectric sublayer;
a second dielectric sublayer on the first dielectric sublayer and having a material different than the first dielectric sublayer; and
a third dielectric sublayer on the second dielectric sublayer and having a same materials the first dielectric sublayer.

7. The integrated circuit of claim 1, wherein the contact height of the first and second gate metals is and higher than a bottom surface of the dielectric layer.

8. The integrated circuit of claim 1, wherein the dielectric layer has a lateral width substantially equal to a lateral width of the first semiconductor nanostructure.

9. The integrated circuit of claim 1, comprising:
a first source/drain region of the first transistor coupled to the first semiconductor nanostructure;
a second source/drain region of the second transistor above the first semiconductor nanostructure and coupled to the second semiconductor nanostructure; and
a dielectric structure between the first and second nanostructure and in contact with the first source/drain region, the second source/drain region, and the dielectric layer.

10. An integrated circuit, comprising:
a complementary field effect transistor including:
a first transistor having a first semiconductor nanostructure corresponding to a channel region of the first transistor a first gate metal surrounding the first semiconductor nanostructure;
a second transistor having a second semiconductor nanostructure above the first semiconductor nanostructure and corresponding to a channel region of the second transistor a second gate metal surrounding the second semiconductor nanostructure, the second gate metal being above and in contact with the first gate metal; and
an isolation structure including:
a dielectric layer between the first semiconductor nanostructure and the second semiconductor nanostructure,
a first semiconductor layer between the dielectric layer and the first semiconductor nanostructure; and
a second semiconductor layer between the dielectric layer and the second semiconductor nanostructure, wherein the first and second semiconductor layers are thinner than the first semiconductor nanostructure.

11. The integrated circuit of claim 10, wherein:
the first gate metal has a top surface lower than a top of the isolation structure; and
the second gate metal has a bottom surface higher than a bottom of the isolation structure.

* * * * *